(12) United States Patent
Meng et al.

(10) Patent No.: US 10,673,009 B2
(45) Date of Patent: Jun. 2, 2020

(54) PLANAR ELECTROLUMINESCENT DEVICES AND USES THEREOF

(71) Applicant: Peking University Shenzhen Graduate School, Shenzhen (CN)

(72) Inventors: Hong Meng, Shenzhen (CN); Dan Hu, Shenzhen (CN); Xiuru Xu, Shenzhen (CN); Lijia Yan, Nanjing (CN); Wei Huang, Nanjing (CN)

(73) Assignee: Peking University Shenzhen Graduate School, Nan shan, Shenzhen ( * ) Notice: Subject to any disclaimer, the term of this patent is extended or adjusted under 35 U.S.C. 154(b) by 75 days.

(21) Appl. No.: 15/682,509

(22) Filed: Aug. 21, 2017

(65) Prior Publication Data
US 2018/0090709 A1     Mar. 29, 2018

Related U.S. Application Data

(63) Continuation-in-part of application No. PCT/US2016/037825, filed on Jun. 16, 2016.

(30) Foreign Application Priority Data

Jun. 19, 2015  (CN) .......................... 2015 1 0345516
Mar. 21, 2017  (CN) .......................... 2017 1 0168774

(51) Int. Cl.
| | | |
|---|---|---|
| *H01L 51/52* | (2006.01) | |
| *H01L 51/50* | (2006.01) | |
| *C09K 11/06* | (2006.01) | |
| *B43L 1/00* | (2006.01) | |
| *H01L 51/00* | (2006.01) | |

(52) U.S. Cl.
CPC .......... *H01L 51/5206* (2013.01); *B43L 1/006* (2013.01); *C09K 11/06* (2013.01); *H01L 51/0096* (2013.01); *H01L 51/5056* (2013.01); *H01L 51/5072* (2013.01); *H01L 51/5088* (2013.01); *H01L 51/5092* (2013.01); *H01L 51/5203* (2013.01); *H01L 51/5221* (2013.01); *H01L 51/5253* (2013.01); *H01L 51/5262* (2013.01); *C09K 2211/1022* (2013.01); *C09K 2211/1029* (2013.01); *C09K 2211/186* (2013.01); *H01L 51/004* (2013.01); *H01L 51/006* (2013.01); *H01L 51/007* (2013.01); *H01L 51/0035* (2013.01); *H01L 51/0037* (2013.01); *H01L 51/0058* (2013.01); *H01L 51/0059* (2013.01); *H01L 51/0061* (2013.01); *H01L 51/0072* (2013.01); *H01L 51/0077* (2013.01); *H01L 51/0078* (2013.01); *H01L 51/0081* (2013.01); *H01L 51/0092* (2013.01); *H01L 51/0094* (2013.01); *H01L 2251/301* (2013.01); *H01L 2251/303* (2013.01); *H01L 2251/558* (2013.01)

(58) Field of Classification Search
CPC ............. H01L 27/1446; H01L 27/1443; H01L 51/5206
USPC ......................... 359/272, 253, 296
See application file for complete search history.

(56) References Cited

U.S. PATENT DOCUMENTS

| | | | |
|---|---|---|---|
| 7,119,937 B2 * | 10/2006 | Warner | .................. B60R 1/088 359/272 |
| 2004/0113541 A1 * | 6/2004 | Watanabe | .............. A63H 33/22 313/500 |
| 2013/0048962 A1 * | 2/2013 | Kakimoto | ........... H01L 51/0003 257/40 |

\* cited by examiner

*Primary Examiner* — Monique R Peets
(74) *Attorney, Agent, or Firm* — US-China Intellectual Property Counsel, LLC

(57) ABSTRACT

The present invention provides a planar electroluminescence (EL) device comprising a substrate layer, an electrode layer, a light emitting layer, and a modulating layer, wherein the electrode layer comprises a plurality of electrodes arranged on a same level over the substrate layer, and there is no contact between adjacent electrodes. In one embodiment, the device further comprises a hole injection layer (HIL), a hole transport layer (HTL), an electron injection layer (EIL) and an electrode transport layer (ETL). In one embodiment, the light emitting layer comprises organic light emitting polymers or organic light emitting molecules. The device of the present invention would emit light when liquid, polar component, or conductive solution is written directly on the light emitting layer. In one embodiment, the device can emit light for prolonged period when the light emitting layer is coated or deposited with conductive material.

16 Claims, 15 Drawing Sheets

PLANAR ELECTROLUMINESCENT DEVICES AND USES THEREOF

This application claims the benefit of priority of International application No. PCT/US2016/037825, filed Jun. 16, 2016, which claims the priority of Chinese application No. 201510345516.4, filed Jun. 19, 2015. This application also claims the benefit of priority of Chinese application No. 201710168774.9, filed Mar. 21, 2017. The entire content and disclosure of the preceding applications are incorporated by reference into this application.

FIELD OF THE INVENTION

This application is related generally to the area of electroluminescence. In one embodiment, there is provided electroluminescent devices and uses thereof.

BACKGROUND OF THE INVENTION

The electric field-induced luminescence is also known as Electroluminescence (EL). In 1936, a French scientist G. Destriau discovered this phenomenon for the first time, so it is an 80 years old technology. Destriau found that a powdered fluorescent material when immersed in liquid dielectric material can generate continuous bright light under the application of an alternating electric field. But, in the following 10 years, this phenomenon did not attract much attention. Its significance was doubted and it was hard to realize its potential applications.

Subsequently, Destriau designed and fabricated some other planar EL devices. However, it was not until 1947, when conductive glass was invented, was a research and development boom set off using conductive glass as transparent electrodes for EL devices.

Nevertheless, after another 10 years, limitations on the brightness, life-time and light color of alternating current electroluminescent devices (referred to as ACEL) became evident and people's enthusiasm about EL devices began to subside. Almost at the same time, direct current electroluminescent devices (referred to as DCEL) began to be developed rapidly. In 1971, Chinese researchers found that ZnS: Mn/Cu had better light emitting characteristics under AC voltage compared to DC voltage. This is the only available EL material, so far, that can work with both AC and DC (referred to as ADCEL).

Although EL research continues until today, it is mainly based on display illumination. Moreover, these EL devices having vertical structure with top and bottom electrodes present serious problems like: (1) such structure can only be used for display lighting and cannot meet more diverse needs and uses; (2) since both top and bottom electrodes are required, the production process is more complex and production cost is higher; (3) the structure requires one transparent electrode. If the bottom electrode is transparent, it also requires a transparent substrate, thereby restricting the choice of substrate material.

A number of planar electroluminescent devices are based on inorganic electroluminescent materials. Compared to inorganic electroluminescent material, organic light-emitting materials have low driving voltage, efficient luminescence, abundant color, simple fabrication, low cost, wide selection of materials and so on. Currently, with the increasing development of information technology, people put forward higher requirements on information display technology. Display with abundant color, low energy, environmental protecting, lightweight and even flexible become what people pursue. Compared with other display technology, organic electroluminescence has many superiorities, which just meet the demands of the time. Organic light-emitting devices as an emerging research field constantly attracts more and more people's attention, and it may become a kind of ideal display technology in the information age.

In summary, there is a need for planar EL devices with improved structural arrangements.

SUMMARY OF THE INVENTION

In one embodiment, the present invention provides electroluminescent devices with a novel planar structure.

In one embodiment, the electroluminescent devices can be configured in one of three basic structures. In one configuration, the device comprises a substrate layer, an electrode layer, an insulating layer, and a light emitting layer from bottom to top (see FIG. 1). In another configuration, the device comprises a substrate layer, an electrode layer, a light emitting layer, and an insulating layer from bottom to top (see FIG. 2). In yet another configuration, the device comprises a substrate layer, an electrode layer, and a combined light emitting & insulating layer from bottom to top (see FIG. 3). That is to say, the light emitting layer and the insulating layer can be combined into one layer. In one embodiment, a protecting layer 1 can be added in between the insulating layer and light emitting layer (see FIG. 4-5). In another embodiment, a protecting layer 2 can be added beneath the combined light emitting & insulating layer (see FIG. 6). In one embodiment, devices configured in any one of the above three basic structures may further comprise a modulating layer as the uppermost layer (see FIG. 7-9). In one embodiment, the devices having such modulating layer may further comprise a protecting layer 3 placed beneath the modulating layer (see FIG. 10-12). In another embodiment, an encapsulation layer may also be placed on top of such modulating layer and protecting layer 3 (see FIG. 13-15). In one embodiment, the electrode layer includes a plurality of electrodes, such as electrode A and electrode B, which could be made from the same or different materials, that are arranged on a printed board surface. There is no contact between the adjacent electrode A and electrode B. According to the above description, one can readily construct devices with up to 192 different kinds of arrangements with or without an additional protecting layer 1 or 2 or 3, with or without an additional modulating layer, and/or with or without an additional encapsulation layer.

In one embodiment, the substrate layer can be any nonconductive solid material, for example plastic, cloth, stone, cement, ceramics, glass, leather, polymer resin sheet, wood, or metal material protected by insulator such as plastic, glass, or ceramic. The substrate layer can be configured to have a variety of shapes and sizes.

In one embodiment, the substrate can be made from at least one of glass plate, plastic plate, a ceramic sheet, cloth, wood, or a metal plate. Any materials which can play a supporting role can be used as the substrate. For example, any materials that has a smooth surface can be used as the substrate. One of ordinary skill in the art would readily choose a suitable material as the substrate after taking different conditions into consideration.

In one embodiment, the substrate is to support the electrode layer, insulating layer, light emitting layer and/or the modulating layer. Thus, a variety of generally known support materials can be used as the substrate. Examples of various support materials will be discussed in more detail below. Moreover, the electrode layer, insulating layer and light-emitting layer can be printed on the substrate by a number of conventional film fabrication methods, such as screen printing, ink-jet printing, roll to roll printing, spin coating, dip coating, cast coating, blade coating, gravure coating, electrochemical polymerization, laser induced method, langmuir-blodgett method, plasma enhanced, electrospinning, physical vapor deposition, chemical vapor deposition including atomic layer deposition (ALD), etc.

In one embodiment, the electrodes A and B are printed on the substrate layer at intervals with no contact between adjacent electrodes. For example, the electrodes can be printed in a combed, interdigitated, or concentric circular configuration. One of ordinary skill in the art would readily print and configure the electrodes in various ways to meet various needs. In one embodiment, the width of the gap between electrode A and B can be 0.01 nm-20 cm. In another embodiment, the width of the gap is between 0.1 mm-3.0 mm, or any other width readily configured by one of ordinary skill in the art.

The present invention offers improvement of the electrode layers, i.e. two electrodes are simultaneously printed on the same surface of the substrate. As for the order of other layers, such as the light emitting layer, insulating layer, etc., one can fabricate the device according to conventional techniques. In one embodiment, either the light-emitting layer or the insulating layer can be the uppermost layer. In addition, in order to meet different needs, one of ordinary skill in the art would readily add some other layer(s) onto the EL device of the present invention.

A number of generally known materials can be used to make the light emitting layer and/or the insulating layer. For example, the light-emitting layer may be made of conventional organic or inorganic light emitting materials. Some examples of suitable materials for the light-emitting layer and the insulating layer will be discussed in more detail below. In one embodiment, the thickness of the light emitting layer is 0.01 nm-500 μm, or 1 nm-100 μm, or 50 nm-500 nm, or any other thickness readily configured by one of ordinary skill in the art.

In one embodiment, electrode A and/or B are made of conductive materials such as conductive metals, conductive carbons and polymers, conductive oxides, ionic-polymer components, flexible or stretchable conductive elastomers, or combinations thereof. Examples of conductive metals include, but are not limited to, silver, aluminum, gold, copper, platinum, Fe, alloys of Mg—Al alloy, Cu—Ag alloy, Al—Cu alloy, Fe—Cu—Ag alloy, or combinations thereof. Conductive carbons and polymers can be carbon black, carbon nanotube, graphene, graphite, PEDOT, polypyrrole, PANi, or combinations thereof. Examples of conductive oxides include, but are not limited to, indium-tin oxide, F-doped tin oxide, znic-tin oxide, and combinations thereof. Ionic-polymer components can be one or more ionic salts and one or more polymers. Examples of ionic salt include, but are not limited to, LiF, NaF, LiCl, NaCl, $LiClO_4$, $NaClO_4$, lithium trifluoromethanesulfonate, bis(trifluoromethane sulfonimide), and combinations thereof. The polymer can be polydimethylsiloxane, styrene-butadiene rubber, cis-polybutadiene rubber, polyisoprene rubber, ethylene propylene rubber, isobutylene isoprene rubber, chloroprene rubber, nitrile butadiene rubber, polyarylamide hydrogel, polyvinyl alcohol, natural hydrogel, and combinations thereof. Flexible or stretchable conductive elastomers can be one or more conductive materials, one or more ionic salts, and one or more elastomers, for example silver nanowires/PDMS, graphene/polyarylamide hydrogel, and combinations thereof. In one embodiment, electrodes A and B may be made of the same or different materials. What should be noted is that electrode A and electrode B should be connected to different polarities of a power source.

In one embodiment, the insulating layer is fabricated from material with high dielectric constant. The insulating layer can be prepared with organic or inorganic, high dielectric constant materials or composite materials of high dielectric constant materials. For example, the insulating layer can be made from at least one of barium titanate, titanium oxide, tantalum oxide, silicon dioxide, silicon oxynitride, silicon nitride, sialon, yttrium oxide and aluminum oxide, hafnium oxide, polymer dielectric and composites, or combinations thereof.

In one embodiment, insulating layer is made from organic high dielectric constant materials, for example, polyvinylidene fluoride, polytetrafluoroethylene, polyvinylidene fluoride-triluorinethylene copolymer (P(VDF-TrFE), P(VDF-TrFE-CTFE), P(VDF-TrFE-CFE), polystyrene, polyvinyl alcohol, polyvinylpyrrolidone, polymethyl methacrylate, tetrafluoroethylene six fluoride propyl copolymer, poly(4-methyl-1-pentene), polypropylene, polyethylene, polytrifluorochloroethylene, polyphenyl ether, polycarbonate, ethyl cellulose, CYTOP, polyethylene glycol terephthalate, parylene (p-xylene polymer). Examples of inorganic high dielectric constant materials include, but are not limited to, barium titanate, hafnium oxide, zinc oxide, nickel oxide, aluminium oxide, titanium dioxide, tin oxide, cerium oxide, zirconium oxide, four vanadium oxide, vanadium pentoxide, the perovskite metal oxide ($ABO_3$), tantalum pentoxide, silicon dioxide, silicon oxynitride, silicon nitride, sialon, yttrium oxide, alumina, or combinations thereof. In one embodiment, some effective choices are one or several materials from a group comprising of polyvinylidene fluoride-triluorinethylene copolymer, polystyrene, polyvinyl alcohol, polyvinylpyrrolidone, and polymethyl methacrylate.

In one embodiment, the above device further comprises hole injection layer (HIL), hole transport layer (HTL), electron injection layer (EIL) and electrode transport layer (ETL). As used herein, HIL refers to an interface connection layer between the anode and the HTL, which would have good adhesion to the anode and would serve to smooth the anode surface. It can improve the film forming property of the subsequent organic layer and facilitate efficient hole injection.

As used herein, HTL serves to provide a hole-conductive (via charge hopping) pathway for positive charge carriers to migrate from the anode into the emission layer. Charges are favored to gather in the emission layer and recombine, an exciton is formed. And singlet fluorescence or triplet phosphorescence is emitted. It is very common in small-molecule-based OLED devices but is less common in polymer-based devices because conjugated polymers are usually good hole conductors themselves.

As used herein, EIL refers to an interface connection layer between the cathode and the ETL, which would improve charge injection into the OLED device and benefit to decrease operating voltages and extend lifetime of devices.

As used herein, ETL refers to a conducting material that helps transport electrons from the cathode into the organic layers of the device, for example, transporting the electrons via a hopping mechanism that involves transitory production of anion radicals (negative polarons) in the molecules involved.

In one embodiment, the device comprises the following layers counting from the electrode layer: electrodes/EIL/

ETL/light emitting layer/HTL/HIL/modulating layer. In another embodiment, the layers are: electrodes/HIL/HTL/light emitting layer/ETL/EIL/modulating layer. In one embodiment, each of the hole injection layer (HIL), hole transport layer(HTL), electron injection layer (EIL) and electrode transport layer (ETL) can comprise of multiple layers.

In one embodiment, the hole injection layer (HIL) comprises one or more of the following: copper phthalocryanine (CuPc), acid-doped (for example, using polystyrene sulfonic acid, PSS) PEDOT(poly-3,4-ethylenedioxythiophene), polyaniline (PANi), or polypyrrole (Ppy), 4,4'-bis[(p-trichlorosolylpropyl-pjenyl)phenyla-mino]biphenyl(TPD-Si$_2$Cl), 4,4'-bis[p-methyloxylsilylpropylphenyl]phenyamino]biphenyl (TPD-SI$_2$Ome), SiO$_2$, SiO$_x$N$_y$, and TiO$_2$ or combinations thereof.

In one embodiment, examples of p-type dopants for hole injection layer (HIL) include, but are not limited to, FeCl$_3$, iodine, tetrafluorotetracyanoquinodimethane (F$_4$-TCNQ) and tris(4-bromophenyl)aminium hexachloroantimonate (TBAHA) or combinations thereof.

In one embodiment, the hole transport layer (HTL) comprises one or more of the following: N,N'-(3-methylphenyl)-1,1'-biphenyl-4,4'-diamine (TPD), 4,4'-bis[N-(1-naphthyl-1)-N-phenyl-amino]-biphenyl (α-NPD), 1,3,4,5,6,7-hexaphenyl-2-{3'-(9-ethylcarbazolyl)}-isoindole (HPCzI) and 4,4',4''-tri(N-dibenzo[a,g]carbazoyl)triphenylamine (TDCTA) or combinations thereof.

In one embodiment, the hole injection layer (EIL) comprises one or more of the following: Li$_2$O, Cs$_2$CO$_3$, LiF, CsF, Liq, LiMeq, Naq, Liacac, LiBPP or combinations thereof.

In one embodiment, examples of n-type dopants for electron injection layer (EIL) include, but are not limited to, Li, Na, K, Mg, Ca, 1,3-Dimethyl-2-phenyl-2,3-dihydro-1H-benzoimidazole (DMBI) and (4-(1,3-dimethyl-2,3-dihydro-1H-benzoimidazol-2-yl)phenyl)dimethylamine (N-DMBI) or combinations thereof.

In one embodiment, the electron injection layer (ETL) comprises one or more of the following: Alq$_3$, bis(2-(2-hydroxyphenyl)benzothiazolate)zinc(II) (Zn(BTZ)$_2$), 1,3,5-tris(N-phenylbenzimidizol-2-yl)benzene (TPBI), Beryllium chelates bis(2-(2-hydroxyphenyl)-pyridine)beryllium (Beq$_2$), bis(10-hydro-xybenzo-quinolinato)beryllium (BeBq$_2$) and 5(4-biphenyl)-2-(4-tert-buty-phenyl)-1,3,4-oxadiazole (PBD) or combinations thereof.

In one embodiment, the light emitting layer comprises one or more of crystal particles, wires, belts, fibers, quantum dots, or combinations thereof. For example, the light emitting layer may comprise one or more of ZnS, ZnSe, ZnO, ZnTe, CdSe, CdS, CdTe, CaS, SrS, CsPbX$_3$, CH$_3$NH$_3$PbX$_3$ (X=Cl, Br or I), and combinations thereof. The quantum dots in the light emitting layer may be bare, alloys, or core-shell structure, and combinations thereof. The light emitting layer may be undoped or doped, the doping materials can be one or more of manganese, copper, carbon nanotubes, silver, gold, aluminum, lead ions or rare earth ions, or combinations thereof. Examples of rare earth ions include, but are not limited to, europium, cerium, erbium, samarium, neodymium, and combinations thereof.

In one embodiment, the light emitting layer comprises one of the following: organic light-emitting polymers or organic fluorescent molecules, organic phosphorescent molecules, thermally activated delayed fluorescence (TADF), perovskite light emitting materials, quantum dots materials, or combinations thereof.

In one embodiment, examples of organic light-emitting polymers include, but are not limited to, Super yellow (SY-PPV), Bu-PPP, PFO, PVK, F8BT, MEH-PPV, PFO (DMP end capped), PFOPV, TFB, PFOBPA, PFB, MDMO-PPV, PCz, or combinations thereof. The chemical structure formulas of several typical organic light-emitting polymers are shown below:

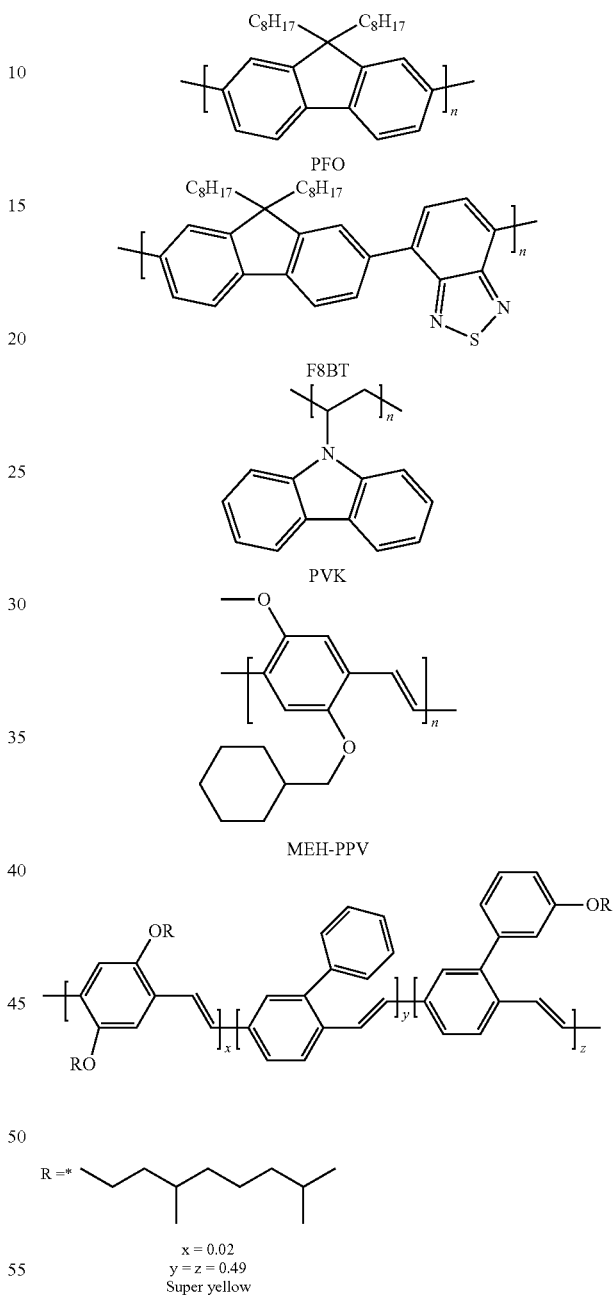

In one embodiment, examples of organic fluorescent or phosphorescent molecules include, but are not limited to, CBP, Alq$_3$, TBCPF, mCP, 26DCzPPY, Ir(mppy)$_3$, Ir(piq)$_2$(acac), Ir(hpiq)$_3$, Ir(ppy)$_3$, Ir(bt)$_2$(acac), Ir(pbi)$_2$(acac), Ir(ppy)$_2$(acac), FCNIrPic, PhFlrPic, FirPic, PO-01-TB, PO-01, 6,12-dobenzylchrysene and α,β-AND series, or combinations thereof. The chemical structure formula of several typical organic fluorescent or phosphorescent molecules are shown below:

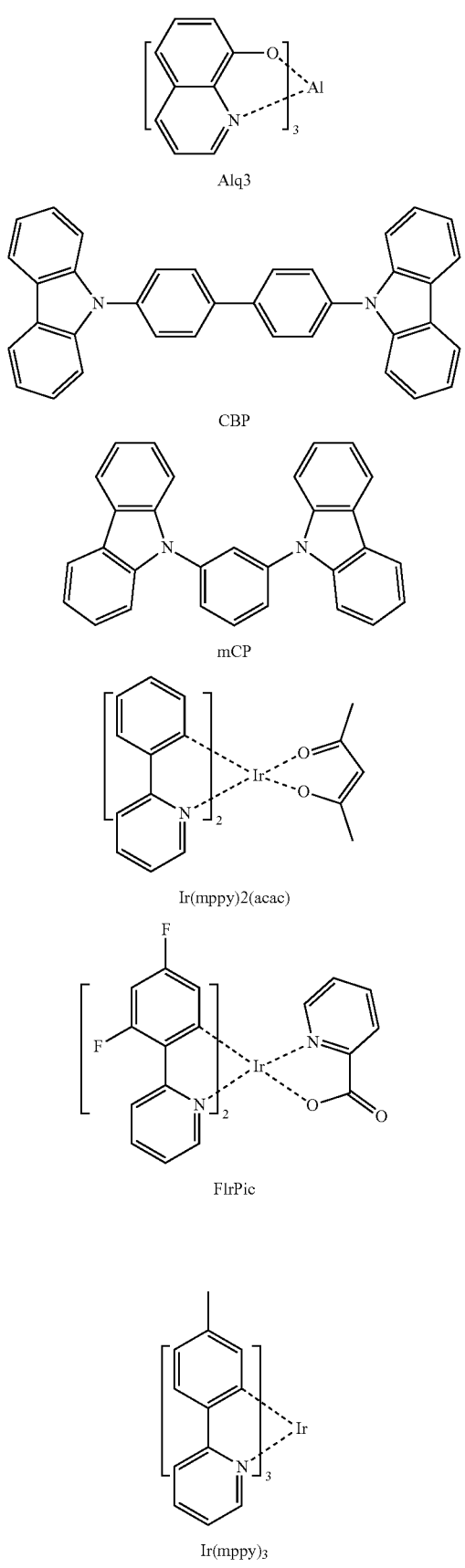
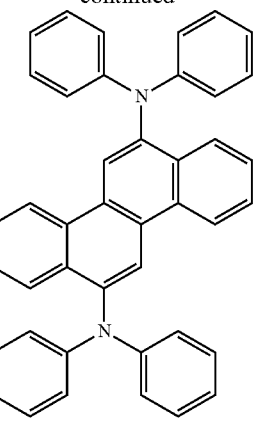
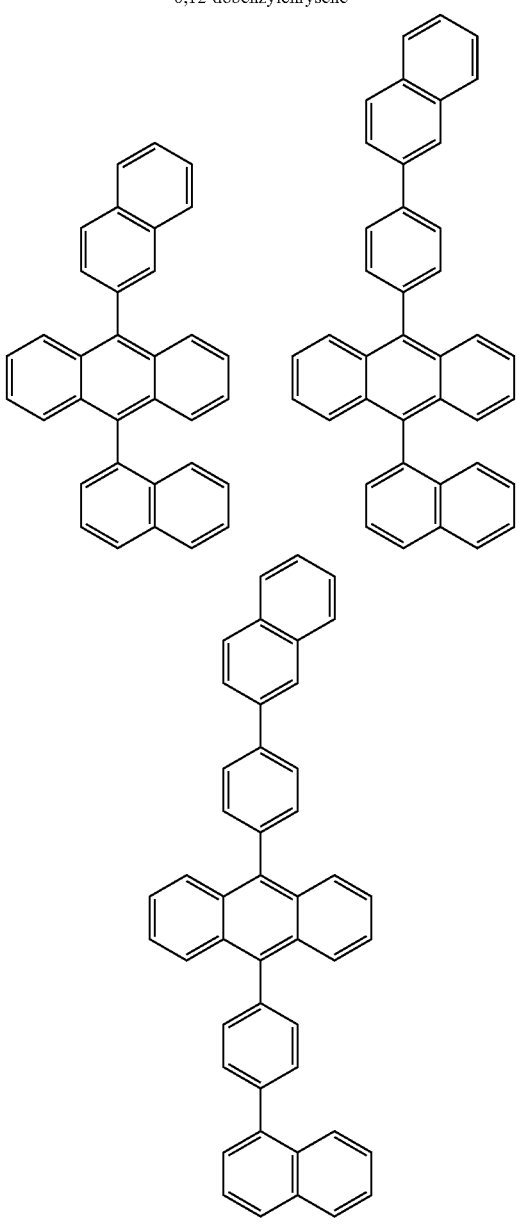

Thermally activated delayed fluorescence (TADF) is the third generation of organic light-emitting materials following organic fluorescence materials and organic phosphorescence materials. This type of material generally has a small energy difference between the singlet and triplet states (DEST). Triplet excitons can pass through and transform into singlet excitons to emit light. It can make full use of the formation of singlet exciton and triplet excitons under electric stimulation. The internal quantum efficiency can reach to 100%. At the same time, easily controlled material structure, stable properties, low cost and not including precious metals, make the TADF have wide application prospects in the field of OLEDs. In one embodiment, examples of TADFs include, but are not limited to, BCPO, 2CzPN, 4CzPN, 4CzIPN, 4CzTPN, 4CzTPN-Bu, 4CzPN-Ph, 4CzTPN-Ph, 4CzPN-Bu, DMAC-DPS, DPEPO, or combinations thereof. The chemical structure formula of several typical TADF materials are shown in the figure below:

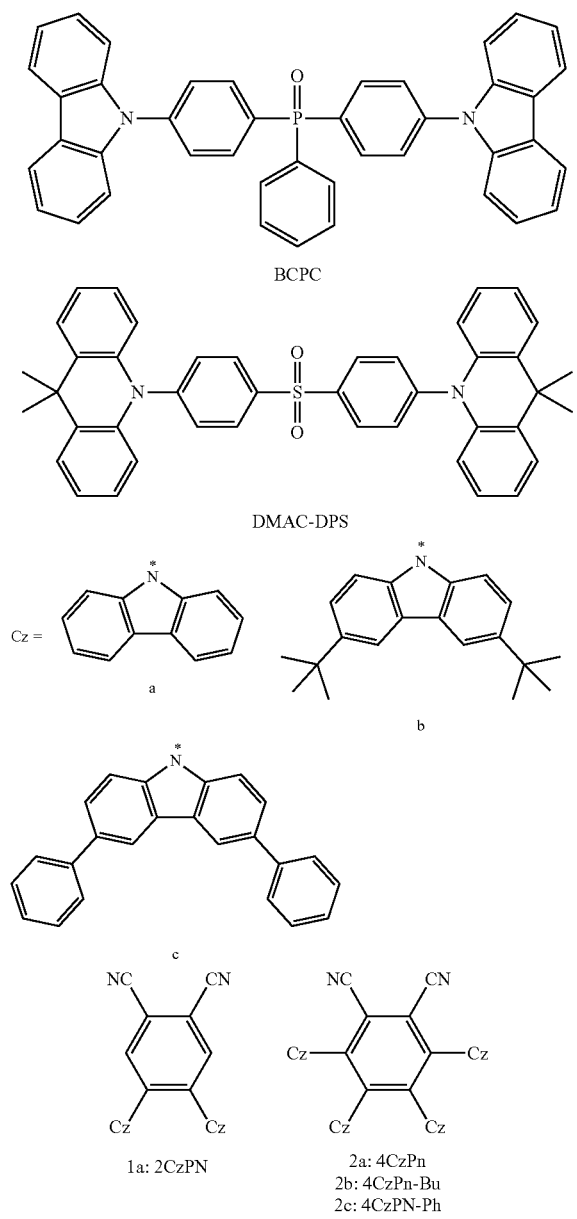

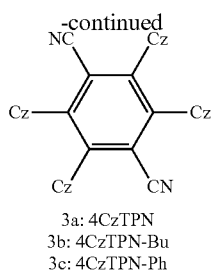

3a: 4CzTPN
3b: 4CzTPN-Bu
3c: 4CzTPN-Ph

Perovskite materials can absorb 390-790 nm spectrum, have large optical absorption coefficient, low volume defect density, slow auger recombination, and balanced bipolar transmission characteristics. All of these make perovskite materials have significant advantages in high luminous efficiency. At the same time, characteristics such as solution processing, and flexibility make it easy to process, low cost, and able to fabricate over large areas. In aspects of display, lighting, and optical communications, it has broad application prospects. In one embodiment, examples of inorganic or organic inorganic hybrid perovskite materials include, but are not limited to, $CsPbX_3$, $CH_3NH_3PbX_3$, 2D-perovskite (e.g. $(PMA)_2PbX_4$ or $(NMA)_2PbX_4$), or combinations thereof (here, X=Cl, Br or I, PMA is Benzylamine, NMA is Naphthalenemethylami).

Quantum dot also can be called nanocrystalline, which is one kind of nanoparticles made of group II-VI or III-V in the periodic table. The size of quantum dot is generally 1-10 nm. Because the electrons and holes is quantum confined, continuous band structure changes into discrete energy level structure with molecular properties, and emits fluorescence after stimulation. In one embodiment, examples of quantum dots include, but are not limited to, 3D or 2D perovskite quantum dots, carbon quantum dots and ZnS, ZnSe, ZnO, ZnTe, CdSe, CdS, CdTe, CaS, SrS. In another embodiment, the quantum dots can be divided into one-component, multicomponent, core-shell structure, etc. At the same time, its morphologies include nanoparticles, nanobelts and nanowires.

In another embodiment, the present invention provides a light-emitting writing board comprising the EL devices of the present invention. In one embodiment, when the EL devices of the present invention are configured as writing boards, a writing fluid must cover electrodes A and B in order to emit light. Therefore, it is understood that brightness of the emitted light is determined to a certain extent by the spacing between the electrodes A and B. Results from application experiments show that the luminance is reduced when the separation between electrodes A and B increases. Hence, it is understood that for some uses where less luminance is required, the spacing between electrodes A and B could be larger.

In one embodiment, the planar electroluminescent device of the present invention configured as a writing board can emit light when a polar solvent or polar liquid component is placed directly above the light-emitting layer. For example, light is emitted when water is placed above the light-emitting layer; when the water is evaporated, no light is emitted. Therefore, a light-emitting writing board can be easily fabricated. In addition to water, ethanol, acetic acid, etc. can also be used as writing liquid on the writing board to emit light. Alternatively, conductive solution such as sodium chloride solution can also be used as writing liquid.

In yet another embodiment, the present invention provides a lighting display device comprising the electroluminescent devices discussed herein. In one embodiment, the surface of such lighting device is coated with a modulating layer, which is fabricated from conductive material or polar liquid.

It should be noted that the planar electroluminescent device of the present invention not only can be used as a writing board when polar or conductive solution is written above it, it can also be used as a lighting device if the device is coated with a modulating layer that would enable long-term luminance. The modulating layer can be made from conductive material, or a polar solution. It is understood that conductive materials and polar solution can make the electroluminescent device give out light. Hence, fabricating a conductive layer above the electroluminescent device surface by conventional coating method or other film-forming methods would render the device as a lighting device. Polar solution also can make the electroluminescent device give out light. But, if a solution is used, the solution needs to be transparent and be encapsulated.

It should be noted that the addition of modulating polarization layer would let the planar electroluminescent device emit light. However, if the polarization layer is too thick, it will affect the intensity of the light. Therefore, in one embodiment, the thickness of the modulating layer is 0.01 nm-10 cm, or from 1 μm to 100 μm, or from 5 nm-50 nm, or any other thickness readily configured by one of ordinary skill in the art.

In one embodiment, the modulating polarization layer would include fluorescent or phosphorescent material. It should be noted that addition of fluorescent or phosphorescent material is intended to improve the luminance and change the light color. In other words, after adding a modulating layer, the device can emit light; if one add some different fluorescence or phosphorescent materials in the modulating polarization layer, the device can emit light with different colors.

In one embodiment, the modulating layer in this invention can be made from electronic conductive materials, ionic conductive materials or polar materials. Conductive electrode materials, ionic liquid, water gel, gel electrolytes, or solid electrolytes, containing or not containing fluorescence or phosphorescence materials can be used as modulating materials.

In one embodiment, the cation of ionic conductive material of modulating layer comprises:

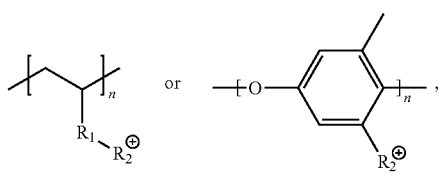

where,

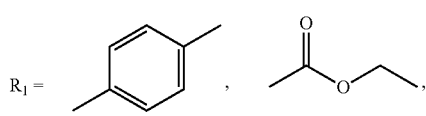

methyl, ethyl, propyl (n-, iso-), butyl (n-, iso-, tert-);

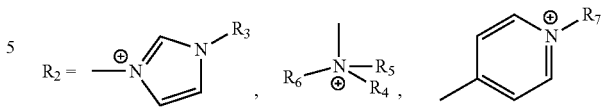

the anion of ionic liquid comprises:

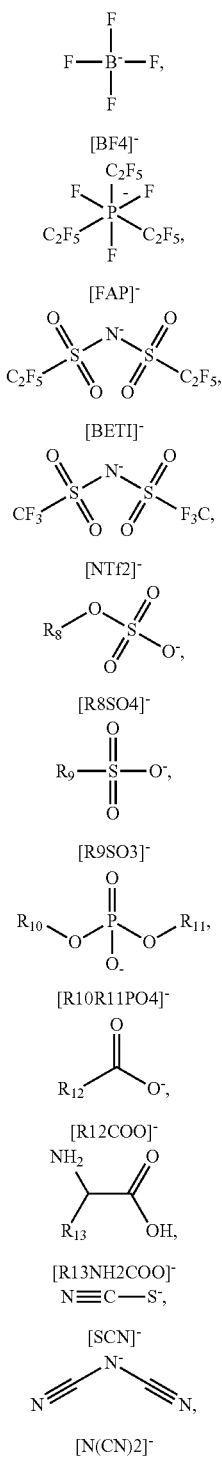

-continued

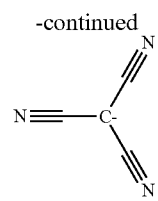

[N(CN)$_3$]$^-$,

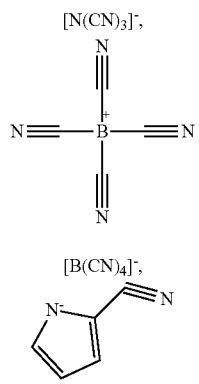

[B(CN)$_4$]$^-$,

[2-CNpyr]$^-$, [Cl]$^-$, [Br]$^-$, [CoCl$_4$]$^-$, [MnCl$_4$]$^-$, [FeCl$_4$]$^-$.

where, R$_3$~R$_{13}$ is methyl, ethyl, propyl (n-, iso-), hydroxy, carboxyl, butyl (n-, iso-, tert-), (CH$_2$)$_2$CN (n=3, 5).

It should be further noted that as long as conductive or polar material is placed on the surface of the planar electroluminescent device discussed herein, light is emitted and such planar electroluminescent device can be used as a lighting device or a writing board. Different conductive or polar material would have different conductive or polar performances, resulting in different luminescent intensity. Conventional conductive material, such as metal, conductive oxide material, conductive graphite, carbon nanotubes, graphene, conducting polymers and so on, can be used in this application. Representative examples include, but are not limited to, Al, Ag, Au, Cu, Mg—Al alloy, Cu—Ag alloy, Al—Cu alloy, Fe, Fe—Cu alloy, PEDOT, ITO, etc.

In summary, the present invention provides an improved electroluminescent device comprising an electrode layer containing two or more electrodes that are printed on the same plane of a substrate. Insulating layer and light emitting layer can be added onto the electrode layer. The electroluminescent device could be configured into planar device that would emit light when polar solvent or conductive solution or polar liquid component, which is used as writing liquid, is put on its surface. Alternatively, the planar electroluminescent device can be coated with a conductive material to allow long-term light emission.

DETAILED DESCRIPTION OF THE INVENTION

The present invention provides electroluminescent devices with a novel planar structure. In one embodiment, the devices comprise two or more electrodes, such as electrode A and electrode B, which are printed on the same plane of a substrate. Electrode A and electrode B can be spaced on the surface of the substrate in a variety of ways. For example, the electrodes can be arranged in parallel, or be arranged in a number of patterns, as long as electrode A and B are spaced and there is no contact between adjacent electrodes. When in use, electrode A and B are connected to the positive and negative poles of a power source in order to emit light.

In one embodiment, the electroluminescent device can be configured as a writing board, wherein the board will emit light when a polar solvent or mixed polar solution or conductive solution is applied onto the surface of the board as writing liquid. In addition to water, polar solvent such as water, ethanol, ethylene glycol, polyethylene glycols, acetic acid etc can also be used. In another embodiment, mixed solvent solution can be used, for example petroleum ether: ethyl acetate at 3:1 ratio.

It should note that if conductive ion aqueous solution is used as writing fluid, the writing board will continue to emit light after the water is evaporated as long as conductive ions still exist on the surface of the board. In another embodiment, one may use an ordinary fluorescent highlighter to write on the writing board. The operating principle is that the polar solvent or conductive ion in the highlighter would excite the board to give out light, which in turn would excite the fluorescent material from the highlighter to produce color. In this way, one may write on the board in different color.

Figure 16:
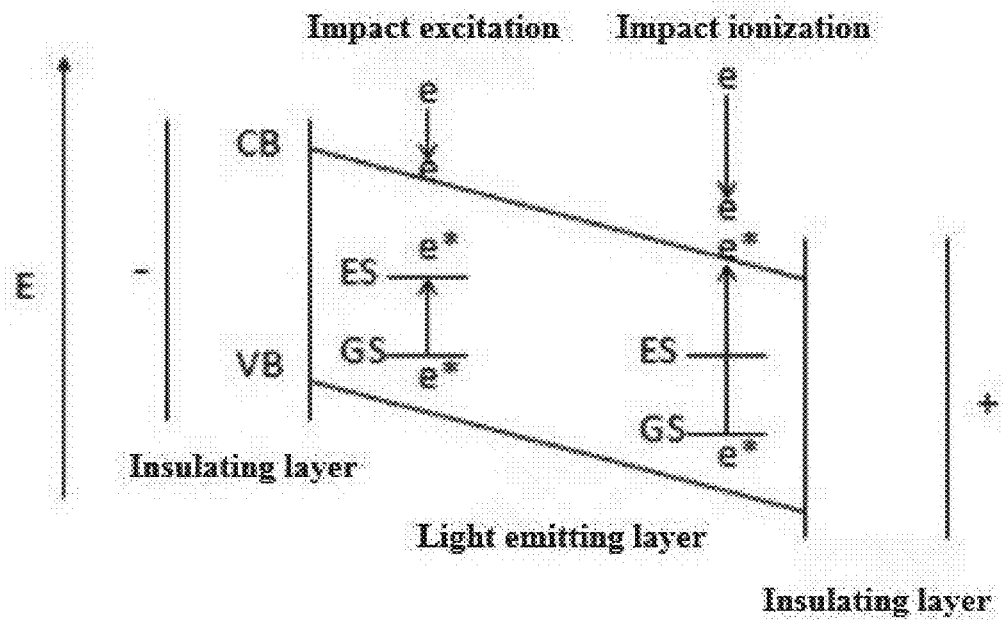
FIG. 16 shows a schematic diagram of light emitting principle of the present invention.

The light-emitting mechanism of an EL device can be explained by a model of impact ionization. As shown in FIG. 16, the energy band of a light-emitting layer is tilted under the influence of an electric field. When a low voltage is applied, the electrons cannot tunnel into the light emitting layer due to the presence of the insulating layer. When the voltage reaches the critical threshold voltage, the strong electric field would enable the electrons at the interface to tunnel into the insulating layer. Generally, the electric field of the light emitting layer have to reach $10^6$~$10^7$ V/m to meet the critical condition for electron tunneling. Electrons tunneled into the host lattice are accelerated by the electric field to collide with the luminescent centers of the light emitting layer, thereby becoming ionized. The luminescence centers are, for example, elements such as Cu, Cl, Mn etc that present in doped ZnS. Electrons and holes (particles deficient in electrons) move in opposite direction under the electric field, and there is no chance for them to recombine. When the applied voltage is reversed, they move toward each other and recombine. That is to say, when $Cu_xS$—ZnS heterojunction is under a positive bias, the trapped electrons are released and accelerated under the external electric field, resulting in impact ionization. The generated electrons continue to move to the positive terminal, whereas the holes are captured by the luminescence centers. When $Cu_xS$—ZnS heterojunction is under a negative bias, electrons can tunnel into the conduction band of ZnS and recombine with the captured holes to emit light.

When the electroluminescent (EL) device of the present invention is configured into a planar writing board, the planar EL device needs polar or conductive solutions to emit light. This is because the polar solution changes the capacitance of the whole device, and the conductive solution can change the resistance of the whole device. These changes cause the electric field of the light emitting layer reaches the critical electric field for luminescence and light emission. Stronger light is emitted after a polar solvent or conductive solution is written on the writing board, or coating the device with a conductive layer. This is because the polar solvent is equivalent to capacitance that would increase the electric field of the light-emitting layer, thereby increasing electrons tunneling and the chances of colliding with the luminescent centers. As for conductive solvents or solids, they would form connected structure with the light emitting layer to reduce the resistance, increase the field intensity, thereby enhancing light emission.

The planar electroluminescent device of the present invention can be written upon directly by some writing liquid to emit light. In another embodiment, the device can be configured as a lighting device. The manufacturing process is very simple; since the electrode A and electrode B are printed on the same surface of a substrate, it does not require printing two vertically stacked electrode layers. In addition, compared with conventional EL devices, the present invention does not require special transparent electrodes, and the substrate can be chosen from a wide range of materials.

In one embodiment, the present invention provides a planar electroluminescent device comprising a substrate layer, an electrode layer, an insulating layer and a light emitting layer, with or without a modulating layer, wherein the electrode layer comprises a plurality of electrodes that are arranged on the same level over the substrate layer, and there is space between adjacent electrodes so that there is no contact between adjacent electrodes, wherein the electrode layer is covered by the insulating layer, which in turn is covered by the light emitting layer, or the electrode layer is covered by the light emitting layer, which in turn is covered by the insulating layer. In one embodiment, adjacent electrodes are made from the same or different material.

In one embodiment, the substrate is made from glass, plastic, ceramic, cloth, wood, metal, or combinations thereof.

In one embodiment, the present invention further comprises an insulating layer that is either between the electrode layer and the light emitting layer or between the light emitting layer and the modulating layer.

In one embodiment, the insulating layer is made from doped or undoped, organic or inorganic, high dielectric constant materials.

In one embodiment, the organic, high dielectric constant materials comprise at least one of the following group: polyvinylidene fluoride, polytetrafluoroethylene, polyvinylidene fluoride-triluorinethylene copolymer, polystyrene, polyvinyl alcohol, polyvinylpyrrolidone, polymethyl methacrylate, tetrafluoroethylene six fluoride propyl copolymer, poly(4-methyl-1-pentene), polypropylene, polyethylene, polytrifluorochloroethylene, polyphenyl ether, polycarbonate, ethyl cellulose, CYTOP, polyethylene glycol terephthalate, or parylene (p-xylene polymer).

In one embodiment, examples of inorganic, high dielectric constant materials include, but are not limited to, barium titanate, hafnium oxide, tantalum pentoxide, silicon dioxide, silicon oxynitride, silicon nitride, Sialon, yttrium oxide, alumina, or combinations thereof.

In one embodiment, the light emitting layer is 1 nm-100 µm or from 50 nm-500 nm. In one embodiment, the light emitting layer comprises one or more of the following: organic light emitting polymers, organic light emitting molecules, thermally activated delayed fluorescence (TADF) materials, inorganic or organic-inorganic hybrid perovskite materials, quantum dots materials, or combinations thereof.

In one embodiment, examples of the aforementioned organic light emitting polymers include, but are not limited to, Super yellow (SY-PPV), Bu-PPP, PFO, PVK, F8BT, MEH-PPV, PFOPV, TFB, PFOBPA, PFB, MDMO-PPV, PCz, or combinations thereof.

In one embodiment, examples of the aforementioned organic light emitting molecules include, but are not limited to, CBP, Alq$_3$, TBCPF, mCP, 26DCzPPY, Ir(mppy)$_3$, Ir(piq)$_2$(acac), Ir(hpiq)$_3$, Ir(ppy)$_3$, Ir(bt)$_2$(acac), Ir(pbi)$_2$(acac), Ir(ppy)$_2$(acac), FCNIrPic, PhFlrPic, FirPic, PO-01-TB, PO-01, 6,12-dobenzylchrysene and α,β-AND series, or combinations thereof.

In one embodiment, the light emitting layer comprises one or more of crystal particles, wires, belts, fibers, quantum dots, or combinations thereof.

In one embodiment, the light emitting layer comprises one or more of ZnS, ZnSe, ZnO, ZnTe, CdSe, CdS, CdTe, CaS, SrS, CsPbX$_3$, CH$_3$NH$_3$PbX$_3$ (X=Cl, Br or I), or combinations thereof.

In one embodiment, the modulating layer is 0.01 nm-10 cm thick, or from 1 µm to 100 µm. In one embodiment, the modulating layer comprises one or more of electronic conductive material, ionic conductive material or polar material, ionic liquid, water gel, gel electrolyte, or solid electrolyte.

In one embodiment, the modulating layer further comprises fluorescence or phosphorescence materials.

In one embodiment, the modulating layer comprises cations of one of the following ionic conductive material:

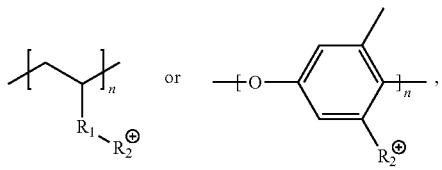

where,

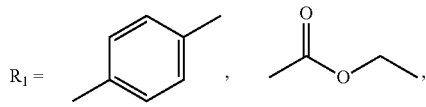

methyl, ethyl, propyl (n-, iso-), or butyl (n-, iso-, tert-);

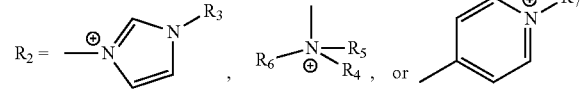

In one embodiment, the modulating layer comprises anions of one of the following ionic conductive material:

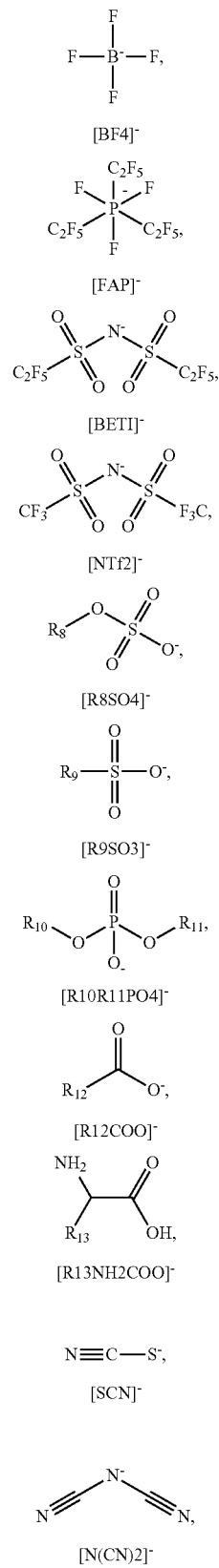

-continued

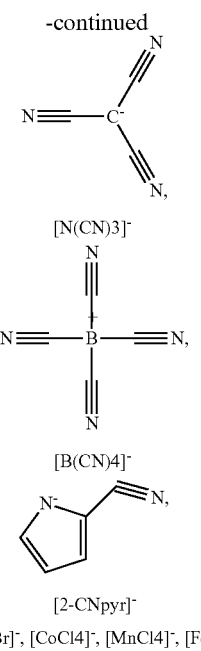

[N(CN)3]⁻, [B(CN)4]⁻, [2-CNpyr]⁻

[Cl]⁻, [Br]⁻, [CoCl4]⁻, [MnCl4]⁻, [FeCl4]⁻.

where, $R_3$~$R_{13}$ is methyl, ethyl, propyl (n-, iso-), hydroxy, carboxyl, butyl (n-, iso-, tert-), $(CH_2)_2CN$ (n=3, 5).

In one embodiment, the electrodes comprise one or more of conductive metals, conductive carbons and polymers, conductive oxides, ionic-polymer components, flexible or stretchable conductive elastomers, or combinations thereof.

In one embodiment, examples of conductive metals include, but are not limited to, silver, aluminum, gold, copper, platinum, Fe, Mg—Al alloy, Cu—Ag alloy, Al—Cu alloy, Fe—Cu—Ag alloy, or combinations thereof.

In one embodiment, examples of conductive carbons and polymers include, but are not limited to, carbon black, carbon nanotube, graphene, graphite, PEDOT, polypyrrole, PANi, or combinations thereof.

In one embodiment, the conductive oxides are indium-tin oxide, F-doped tin oxide, zinc-tin oxide, or combinations thereof.

In one embodiment, the flexible or stretchable conductive elastomers comprise one or more conductive materials and one or more elastomers.

In another embodiment, the present invention provides a light emitting writing board comprising any one of the electroluminescent devices described herein, wherein light is emitted when a writing fluid is placed on the surface of the writing board. In one embodiment, the writing fluid comprises one or more of polar materials. For example, the polar materials can be water or polyethylene glycols.

In another embodiment, the present invention provides a kit comprising the above light emitting writing board and an instrument comprising a writing fluid. In one embodiment, the writing fluid comprises polar solvent or polar liquids.

In another embodiment, the present invention provides a lighting device comprising any one of the electroluminescent devices described herein, wherein the lighting device is covered with a modulating layer. In one embodiment, the modulating layer comprises solid, liquid, or hydrogel. In another embodiment, the modulating layer further comprises fluorescent or phosphorescent material.

In one embodiment, there is provided a planar electroluminescent device comprising a substrate layer, an electrode layer, an insulating layer, and a light emitting layer, wherein the electrode layer comprises a plurality of electrodes that are arranged on the same level over the substrate layer, and there is space between adjacent electrodes so that there is no contact between adjacent electrodes, wherein the electrode layer is covered by the insulating layer, which in turn is covered by the light emitting layer, or the electrode layer is covered by the light emitting layer, which in turn is covered by the insulating layer. In one embodiment, the device further comprises one or more of protecting layers. In another embodiment, the device further comprises a modulating layer. In yet another embodiment, the device further comprises an encapsulation layer.

In one embodiment of the above device, the space between adjacent electrodes is 0.01 nm to 5 cm wide, or from 0.1 mm to 3 mm wide, or any other width readily configured by one of ordinary skill in the art. In one embodiment, the electrodes comprise one or more of conductive metals, conductive carbons and polymers, conductive oxides, ionic-polymer components, flexible or stretchable conductive elastomers, or combinations thereof. In one embodiment, examples of conductive metals include, but are not limited to, silver, aluminum, gold, copper, platinum, Fe, Mg—Al alloy, Cu—Ag alloy, Al—Cu alloy, Fe—Cu—Ag alloy, or combinations thereof. In another embodiment, examples of conductive carbons and polymers include, but are not limited to, carbon black, carbon nanotube, graphene, graphite, PEDOT, polypyrrole, PANi, or combinations thereof. In one embodiment, the conductive oxides can be indium-tin oxide, F-doped tin oxide, znic-tin oxide, or combinations thereof. In another embodiment, the ionic-polymer components can be an ionic salt and a polymer. Examples of ionic salts are LiF, NaF, LiCl, NaCl, $LiClO_4$, $NaClO_4$, lithium trifluoromethanesulfonate, bis(trifluoromethane sulfonimide), and combinations thereof. In one embodiment, the polymer can be polydimethylsiloxane, styrene-butadiene rubber, cis-polybutadiene rubber, polyisoprene rubber, ethylene propylene rubber, isobutylene isoprene rubber, chloroprene rubber, nitrile butadiene rubber, polyarylamide hydrogel, polyvinyl alcohol, natural hydrogel, or combinations thereof. In another embodiment, the flexible or stretchable conductive elastomers comprise a conductive material and an elastomer.

In one embodiment of the above device, adjacent electrodes are made from the same or different materials. In another embodiment, the substrate material can be made of glass, plastic, ceramic, cloth, wood, metal, and combinations thereof. In another embodiment, the insulating layer comprises material with high dielectric constant. For example, the insulating layer may comprise one or more of barium titanate, titanium oxide, tantalum oxide, silicon dioxide, silicon oxynitride, silicon nitride, sialon, yttrium oxide, aluminum oxide, hafnium oxide, polymer dielectric and composites, or combinations thereof.

In one embodiment of the above device, the light emitting layer is 0.01 nm-500 μm thick, or from 10 μm to 30 μm, or any other thickness readily configured by one of ordinary skill in the art. In one embodiment, the light emitting layer comprises one or more of crystal particles, wires, belts, fibers, quantum dots, or combinations thereof. In another embodiment, the light emitting layer comprises one or more of ZnS, ZnSe, ZnO, ZnTe, CdSe, CdS, CdTe, CaS, SrS, $CsPbX_3$, $CH_3NH_3PbX_3$ (X=Cl, Br or I), or combinations thereof. In yet another embodiment, the quantum dots of the light emitting layer comprise one or more of bare, alloys, core-shell structure, or combinations thereof. In another embodiment, the light emitting layer further comprises undoped or doped materials, the doping materials can be manganese, copper, carbon nanotubes, silver, gold, aluminum, lead ions or rare earth ions, and combinations thereof. In one embodiment, examples of rare earth ions include europium, cerium, erbium, samarium, neodymium, and combinations thereof. In one embodiment, the light emitting layer can be further doped by carbon nanotubes, silver nanowires, metal oxide or other materials to enhance its luminescence properties.

In one embodiment, the modulating layer comprises one or more of solid materials, liquid components, hydrogel, or combinations thereof. Examples of the solid materials include, but are not limited to, silver, aluminum, gold, copper, platinum, Fe, alloys of Mg—Al alloy, Cu—Ag alloy, Al—Cu alloy, Fe—Cu—Ag alloy, conductive carbons of carbon black, carbon nanotube, graphene, graphite, conductive oxides of indium-tin oxide, F-doped tin oxide, zinc-tin oxide, and combinations thereof. In another embodiment, the liquid components can be polar solvent, conductive solution, polymer component solution, lyotropic liquid crystal, and combinations thereof. Polar solvents can be water, ethanol, ethylene glycol, polyethylene glycol (Mn≤600), acetic acid, or combinations thereof. Conductive solutions can be NaCl solution, KCl solution, or combinations thereof. Polymer component solution can be one or several polar solvents, one or several polymer with/without conductive material listed herein, with/without fluorescent or phosphorescent material. The polymer can be PVP, PVA, PEO, PAN, PEG (Mn>600), or combinations thereof. In another embodiment, the hydrogels are selected from conductive hydrogel or non-conductive hydrogel. The conductive hydrogel can be an ionic salt, a conductive materials and a hydrogel. The hydrogel can be polyarylamide hydrogel, polyvinyl alcohol, natural hydrogel, and combinations thereof.

In one embodiment of the above device, the protecting layer is 0.01 nm-1 mm thick, or from 5 nm to 100 nm. In one embodiment, the protecting layer comprises one or more of cyano resin based binder, polyester resin, phenol formaldehyde resin, epoxy resin, PVDF, PTFE, P(VDF-TrFE), P(VDF-TrFE-CTFE), P(VDF-TrFE-CFE), and combinations thereof.

In one embodiment, the present invention provides a planar electroluminescent device comprising a substrate layer, an electrode layer, a light emitting layer, and a modulating layer, wherein the electrode layer comprises a plurality of electrodes that are arranged on a same level over the substrate layer, and wherein there is no contact between adjacent electrodes. In one embodiment, adjacent electrodes are made from same or different materials. In one embodiment, the substrate material is made from glass, plastic, ceramic, cloth, wood, metal, or combinations thereof. In one embodiment, the above device further comprises one or more of hole injection layer (HIL), hole transport layer (HTL), electron injection layer (EIL) and electrode transport layer (ETL).

In one embodiment, the above device further comprises an insulating layer which is sandwiched (i) between said electrode layer and said light emitting layer, or (ii) between said light emitting layer and said modulating layer. In one embodiment, the insulating layer is made from doped or undoped organic or inorgainc high dielectric constant materials with a conductivity in the range of 1E-9 S/cm to 1E-3 S/cm. In one embodiment, the organic high dielectric constant material comprises at least one of polyvinylidene fluoride, polytetrafluoroethylene, polyvinylidene fluoride-triuorinethylene copolymer, polystyrene, polyvinyl alcohol, polyvinylpyrrolidone, polymethyl methacrylate, tetrafluoroethylene six fluoride propyl copolymer, poly(4-methyl-1-pentene), polypropylene, polyethylene, polytrifluorochloroethylene, polyphenyl ether, polycarbonate, ethyl cellulose, CYTOP, polyethylene glycol terephthalate, or parylene (p-xylene polymer). In another embodiment, the inorganic high dielectric constant material can be barium titanate, hafnium oxide, tantalum pentoxide, silicon dioxide, silicon oxynitride, silicon nitride, Sialon, yttrium oxide, alumina, or combinations thereof.

In one embodiment, the hole injection layer (HIL), hole transport layer(HTL), electron injection layer (EIL) and electrode transport layer (ETL) are made from doped or undoped materials with a conductivity in the range of 1E-9 S/cm to 1E-3 S/cm.

In one embodiment, the hole injection layer (HIL) comprises one or more of copper phthalocyanine (CuPc), acid-doped (for example using polystyrene sulfonic acid, PSS) PEDOT(poly-3,4-ethylenedioxythiophene), polyaniline (PANi), or polypyrrole (Ppy), 4,4'-bis[(p-trichlorosolylpropyl-pjenyl)phenyla-mino]biphenyl(TPD-Si$_2$Cl), 4,4'-bis[p-methyloxylsilylpropylphenyl]phenyamino]biphenyl (TPD-SI$_2$Ome), SiO$_2$, SiO$_x$N$_y$ and TiO$_2$ or combinations thereof.

In one embodiment, examples of p-type dopants for hole injection layer (HIL) include, but are not limited to, FeCl$_3$, iodine, tetrafluorotetracyanoquinodimethane (F$_4$-TCNQ) and tris(4-bromophenyl)aminium hexachloroantimonate (TBAHA) or combinations thereof.

In one embodiment, the hole transport layer (HTL) comprises one or more of N,N'-(3-methylphenyl)-1,1'-biphenyl-4,4'-diamine (TPD), 4,4'-bis[N-(1-naphthyl-1)-N-phenyl-amino]-biphenyl (α-NPD), 1,3,4,5,6,7-hexaphenyl-2-{3'-(9-ethylcarbazolyl)}-isoindole (HPCzI) and 4,4',4"-tri(N-dibenzo[a,g]carbazoyl)triphenylamine (TDCTA) or combinations thereof.

In one embodiment, the electron injection layer (EIL) comprises one or more of Li$_2$O, Cs$_2$CO$_3$, LiF, CsF, Liq, LiMeq, Naq, Liacac, LiBPP or combinations thereof.

In one embodiment, examples of n-type dopants for electron injection layer (EIL) include, but are not limited to, Li, Na, K, Mg, Ca, 1,3-Dimethyl-2-phenyl-2,3-dihydro-1H-benzoimidazole (DMBI) and (4-(1,3-dimethyl-2,3-dihydro-1H-benzoimidazol-2-yl)phenyl)dimethylamine (N-DMBI) or combinations thereof.

In one embodiment, the electron injection layer (ETL) comprises one or more of Alq$_3$, bis(2-(2-hydroxphenyl) benzothiazolate)zinc(II) (Zn(BTZ)$_2$), 1,3,5-tris(N-phenyl-benzimidizol-2-yl)benzene (TPBI), Beryllium chelates bis (2-(2-hydroxyphenyl)-pyridine)beryllium (Beq$_2$), bis(10-hydro-xybenzo-quinolinato)beryllium (BeBq$_2$) and 5(4-biphenyl)-2-(4-tert-buty-phenyl)-1,3,4-oxadiazole (PBD) or combinations thereof.

In one embodiment, the above device comprises a light emitting layer having a thickness of about 0.01 nm-500 μm.

In one embodiment, the light emitting layer comprises one or more of organic light emitting polymers, organic light emitting molecules, thermally activated delayed fluorescence (TADF) material, inorganic or organic-inorganic hybrid perovskite materials, quantum dots materials, or combinations thereof. In one embodiment, the organic light emitting polymers can be "super-yellow" poly-(phenylene vynilene) (SY-PPV), Poly(2,5-dibutoxybenzene-1,4-diyl) (Bu-PPP), Poly(9,9-di-n-octylfluorenyl-2,7-diyl) (PFO), Poly(9-vinylcarbazole) (PVK), Poly[(9,9-di-n-octylfluore-nyl-2,7-diyl)-alt-(benzo[2,1,3]thiadia-zol-4,8-diyl)] (F8BT), Poly[2-methoxy-5-(2-ethylhexyloxy)phenylenevinylene-1, 4-diyl] (MEH-PPV), Poly[(9,9-dioctylfluorenyl-2,7-diyl)- alt-(2-methoxy-5-(2-ethylhexyloxy)phenylenevinylene-1,4-diyl)] (PFOPV), Poly[(9,9-dioctylfluorenyl-2,7-diyl)-alt-(4,4'-(N-(4-butylphenyl) (TFB), Poly[(9,9-dioctylfluorene-2,7-diyl)-alt-(N,N'-diphenylbenzidine-N,N'-diyl] (PFOBPA), Poly[(N,N'-bis(4-butylphenyl)-N,N'-diphenyl-1,4-benzenediamine)-alt-(9,9-dioctylfluorene-2,7-diyl)] (PFB), Poly[2-methoxy-5-(3,7-dimethyloctyloxy)phenylenevinylene-1,4-diyl] (MDMO-PPV), Poly[N-(1-octylnonyl)-9H-carbazole-2,7-diyl (PCz), or combinations thereof.

In another embodiment, the organic light emitting molecules can be 4,4'-Bis(N-carbazolyl)-1,1'-biphenyl (CBP), Aluminum Tris(8-Hydroxyquinolinate) ($Alq_3$), 9,9-di(4,4'-bis(3,6-Di-tert-butyl-9H-carbazole)-phenyl)-9H-fluorene (TBCPF), 1,3-Di-9-carbazolylbenzene (mCP), 2,6-bis(3-(9H-carbazol-9-yl)phenyl)pyridine (26DCzPPY), Tris[2-(p-tolyl)pyridine-C2,N)]iridium(III) ($Ir(mppy)_3$), Bis(1-phenyl-isoquinoline-C2,N)(acetylacetonato)iridium(III) ($Ir(piq)_2(acac)$), Tris(1-(4-hexylphenyl)-isoquinolinato-C2,N) iridium(III) ($Ir(hpiq)_3$), Tris(2-phenylpyridinato)iridium(III) $Ir(ppy)_3$, Bis(2-phenyl-benzothiazole-C2,N)(acetylacetonate)iridium(III) ($Ir(bt)_2(acac)$), Bis(1,2-diphenyl-1H-benzimidazol-C2,N)(acetylacetonate)iridium(III) ($Ir(pbi)_2(acac)$), Bis(2-phenylpyridinato-C2,N) (acetylacetonate) iridium(III) ($Ir(ppy)_2(acac)$), Bis[2-(5-cyano-4,6-difluorophenyl)pyridinato-C2,N](picolinato)iridium(III) (FCNIrPic), Bis[2-(4,6-difluorophenyl)-4-(2,4,6-trimethylphenyl)pyridinato-C2,N](picolinato)iridium(III) (PhFlrPic), Bis[2-(4,6-difluorophenyl)pyridinato-C2,N](picolinato) iridium(III) (FirPic), Acetylacetonatobis(4-(4-tert-butylphenyl)-thieno[3,2-c]pyridinato-C2,N)iridium (PO-01-TB), Bis (4-phenyl-thieno[3,2-c]pyridinato-C2,N)(acetylacetonato) iridium(III) (PO-01), 6,12-dobenzylchrysene, α,β-AND series, or combinations thereof.

In one embodiment, examples of inorganic or organic-inorganic hybrid perovskite materials and Quantum dots include, but are not limited to, $CsPbX_3$, $CH_3NH_3PbX_3$, 2D-perovskite (e.g. $(PMA)_2PbX_4$ or $(NMA)_2PbX_4$), or combinations thereof (here, X=Cl, Br or I, PMA is Benzylamine, NMA is Naphthalenemethylami), 3D or 2D perovskite quantum dots, carbon quantum dots and ZnS, ZnSe, ZnO, ZnTe, CdSe, CdS, CdTe, CaS, SrS. In another embodiment, the quantum dots can be divided into one-component, multicomponent, or core-shell structure. In one embodiment, their morphologies can be nanoparticles, nanobelts or nanowires.

In another embodiment, the light emitting layer comprises one or more of crystal particles, wires, belts, fibers, quantum dots, or combinations thereof. In another embodiment, the light emitting layer comprises one or more of ZnS, ZnSe, ZnO, ZnTe, CdSe, CdS, CdTe, CaS, SrS, $CsPbX_3$, $CH_3NH_3PbX_3$ (X=Cl, Br or I), or combinations thereof.

In one embodiment, the above device comprises a modulating layer having a thickness of 0.01 nm-10 cm.

In one embodiment, the modulating layer comprises one or more of electronic conductive material (for example, silver, aluminum, gold, copper, platinum, Fe, Ca—Mg alloy, Mg—Al alloy, Cu—Ag alloy, Al—Cu alloy, Fe—Cu—Ag alloy), ionic conductive material or polar material, ionic liquid, water gel, gel electrolyte, or solid electrolyte. In another embodiment, the modulating layer further comprises fluorescence or phosphorescence materials.

In one embodiment, the modulating layer comprises cations of one of the following ionic conductive material:

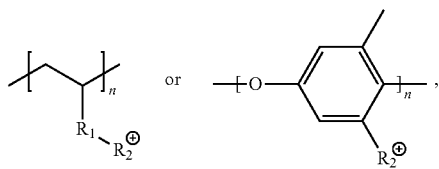

where,

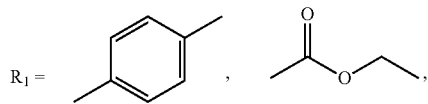

methyl, ethyl, propyl (n-, iso-), or butyl (n-, iso-, tert-);

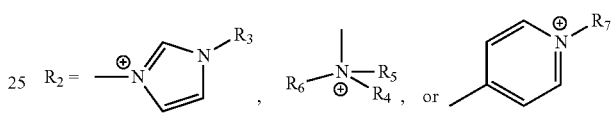

In another embodiment, the modulating layer comprises anions of one of the following ionic conductive material:

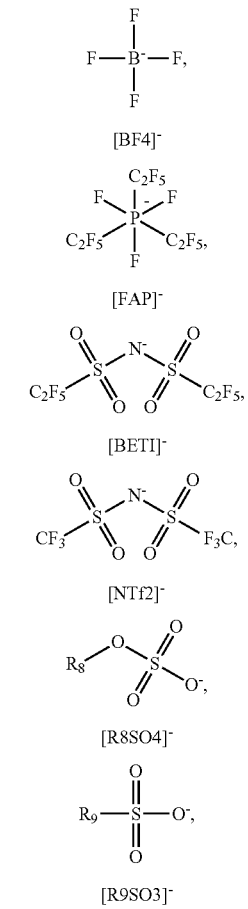

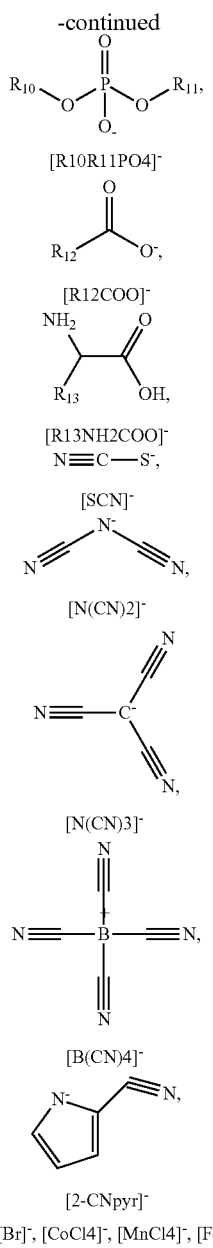

[R10R11PO4]⁻

[R12COO]⁻

[R13NH2COO]⁻

[SCN]⁻

[N(CN)2]⁻

[N(CN)3]⁻

[B(CN)4]⁻

[2-CNpyr]⁻

[Cl]⁻, [Br]⁻, [CoCl4]⁻, [MnCl4]⁻, [FeCl4]⁻.

Where, $R_3$~$R_{13}$ is methyl, ethyl, propyl (n-, iso-), hydroxy, carboxyl, butyl (n-, iso-, tert-), $(CH_2)_2CN$ (n=3, 5).

The present invention also provides a light emitting writing board comprising the electroluminescent device disclosed herein, wherein light is emitted when a writing fluid is placed on the surface of the writing board.

In one embodiment, there is a space of 0.01 nm to 5 cm wide, or from 0.1 mm to 3 mm wide between adjacent electrodes in the electroluminescent device disclosed herein. In one embodiment, the electrodes comprise one or more of conductive metals, conductive carbons and polymers, conductive oxides, ionic-polymer components, flexible or stretchable conductive elastomers, or combinations thereof. For example, the conductive metals can be silver, aluminum, gold, copper, platinum, Fe, Mg—Al alloy, Cu—Ag alloy, Al—Cu alloy, Fe—Cu—Ag alloy, or combinations thereof. In one embodiment, the conductive carbons and polymers comprise one or more of carbon black, carbon nanotube, graphene, graphite, PEDOT, polypyrrole, PANi, or combinations thereof. In another embodiment, the conductive oxides can be indium-tin oxide, F-doped tin oxide, zinc-tin oxide, or combinations thereof. In another embodiment, the flexible or stretchable conductive elastomers comprise one or more conductive materials and one or more elastomers.

The invention being generally described, will be more readily understood by reference to the following examples which are included merely for purposes of illustration of certain aspects and embodiments of the present invention, and are not intended to limit the invention.

Throughout this application, various references or publications are cited. Disclosures of these references or publications in their entireties are hereby incorporated by reference into this application in order to more fully describe the state of the art to which this invention pertains.

Example 1

Figure 1:
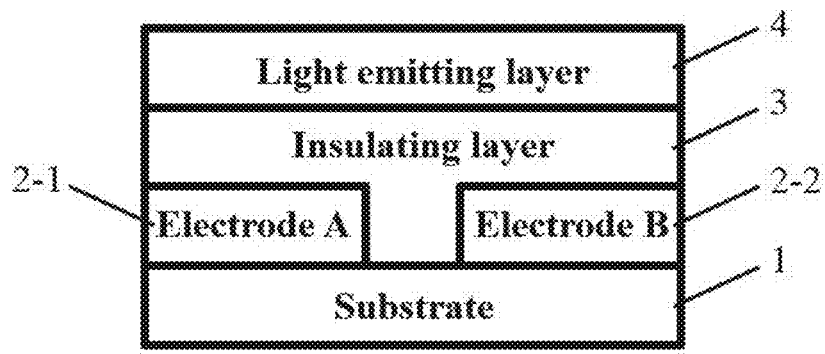
FIG. 1 shows a section view of one embodiment of the electroluminescent device.

In this example, PET plastic is used as a substrate, and the method of fabrication is screen printing. The structure of the planar electroluminescent device is shown in FIG. 1, comprising a substrate layer 1, an electrode layer, an insulating layer 3 and a light emitting layer 4. In one embodiment, the electrode layer includes electrode A 2-1 and electrode B 2-2. The electrodes are printed on the surface of the substrate 1 with gap in between, and form an electrode layer. Adjacent electrodes A 2-1 and the electrode B 2-2 are not in contact with each other. The electrode layer is sandwiched between the insulating layer 3 and the substrate layer 1. The light emitting layer 4 is fabricated on the surface of the insulating layer 3.

In one embodiment, in order to prevent the PET plastic substrate from shrinking in subsequent drying process, and prevent the electrodes from being bonded together to cause a short circuit, the PET plastic was dried in an oven at 100° C. for 30 min.

In this example, commercially available conductive silver paste is used to make the electrodes. It is a viscous mixture including high-purity (99.9%) metallic silver particles, binder, solvent and additives. The quality, content, shape and size of the silver paste would have big effects on the conductive performances. The silver paste was printed onto the substrate using screen printing method, and then the substrate with the electrodes was placed in an oven at 100° C. for 6 min. To ensure the interdigitated electrodes were not short-circuited, the dried electrodes were measured for electrical resistance. If short circuit was detected, appropriate corrections need to be done to remove the short circuit.

Commercially available barium titanate powder was used to make the insulating layer. According to the requirement of different needs, the barium titanate powder was mixed with high dielectric adhesive material at a ratio of 1:100 to 100:1. In this example, they were mixed at 1:1 to prepare a slurry. Using screen printing method, the mixed insulating material was then printed onto the above substrate/electrode board. The resulting composite board was placed in an oven at 100° C. for 5 min. The above printing steps for depositing the insulating layer were repeated three times.

Commercially available light-emitting powder with zinc sulfide as the main component can be mixed with high dielectric adhesive material at a ratio of 1:100 to 100:1. In this example, they were mixed at 1:1 ratio to prepare slurry. Using screen printing method, the mixed light-emitting material was printed onto the above insulating layer. The resulting composite board was placed in an oven at 100° C. for 30 min. Thus the planar electroluminescent device of FIG. 1 was fabricated.

Testing of Electroluminescent Writing Board

The above electroluminescent device was configured into a writing board and tested. AC with frequency 1000 Hz (range 1-100,000 Hz), voltage 100 V (range 1-1000 V) was applied to the device. Electrode A and B were connected to the positive and negative pole, respectively. Different writing liquids were tested, such as polar solvents or polar liquids, high dielectric constant solvents or liquid polymers, non-polar solvents and low dielectric constant solvents. For example, the non-polar solvents or low dielectric constant solvents were toluene, petroleum ether, hexane, liquid paraffin and dioxane. Polar solvents or high dielectric constant solvents were water, ethanol, acetic acid, ethylene glycol, polyethylene glycols, methanol, acetonitrile, and dimethylsulfoxide.

The results show that toluene, petroleum ether, hexane, liquid paraffin and dioxane did not make the planar electroluminescent device emit light, whereas water, ethanol, acetic acid, ethylene glycol, polyethylene glycols, methanol, dimethyl sulfoxide and acetonitrile can make planar electroluminescent device emit light. In addition, solvents with higher dielectric constant or higher polarity did not result in light emission with higher intensity. It was found that the viscosity of the solvent also affect the brightness of the light. Under normal operating voltage (greater than 60 V), the luminance of water and ethanol were basically the same, but slightly brighter than acetic acid. However, acetic acid caused much brighter light output than ethylene glycol. The luminance of water and methanol were basically the same, but brighter than dimethyl sulfoxide. Dimethyl sulfoxide was brighter than acetonitrile.

Testing of Lighting Device

In one embodiment, the above planar electroluminescent device was fabricated into a lighting device as follows: ITO aqueous solution, which has high electric conductivity and non-volatile property, was printed on the light emitting layer using screen printing technique. Cold light intelligent measuring instruments of ShenZhen XinTiJin Science and Technology Ltd were used to measure the brightness of the lighting device at a voltage of 100 V at 1000 Hz.

The test results show that the brightness of the lighting device is about 25 cd/m$^2$ at 100 V and 1000 Hz, and the luminous efficiency is about 0.21 lm/W. Under the same condition, the brightness of conventional lighting display device based on conventional EL device is 30 cd/m$^2$, and the luminous efficiency is about 0.11 lm/W. Therefore, although the lighting display device of the present invention has lower brightness compared with traditional EL device, it has higher luminous efficiency to meet various user needs.

Besides using ITO as conducting material, other materials with good conductivity can also be used, such as aluminium (Al) argentum (Ag) gold (Au) and PEDOT. PEDOT aqueous solution was printed on the light emitting layer using screen printing technique, whereas Al, Ag and Au can be coated on the light emitting layer using the vacuum depositing technology. The results show that Al, Ag, Au and PEDOT have equivalent effects when used as conducting layer material as compared to ITO. In another embodiment, transparent material was used to encapsulate a polar layer on the surface of the planar electroluminescent devices, for the reason that the planar EL device will emit light when the polar solution was placed on the planar electroluminescent devices. Therefore when used as lighting display device, encapsulating a polar solution on its surface directly will also greatly enhance its lighting display luminance. In yet another embodiment, in order to satisfy different lighting effect requirements, one can also add fluorescent powder of different colors into the conducting layer material or the polar solution to make the lighting display devices to emit different colors of light.

Further tests were also done on the electrode, substrate, insulating layer and the light emitting layer. The results show that in addition to silver paste, other metal materials with good conductivity, such as aluminium (Al), gold (Au) and copper (Cu), can also be used to make electrodes. As of materials for the substrate layer, conventional EL substrates could be applied in this invention, such as glass plates, plastic plates, ceramic chips, cloth materials, metal plates, boards and so on. The insulating layer and emitting layer can also be made from traditional materials. Besides barium titanate, silicon dioxide, tantalum pentoxide, silicon dioxide, silicon oxynitride, silicon nitride, Sialon, alumina and yttria can also be used as insulating materials. Besides zinc sulfide, zinc selenide, cadmium sulfide, cadmium selenide, zinc oxide, calcium sulfide and strontium sulfide etc can also be used as light emitting material. As for doping materials, traditional choices are also suitable, such as manganese (Mn), copper (Cu), carbon nanotubes, argentum (Ag), gold (Au), aluminium (Al), lead ion, rare earth ions etc.

Figure 2:
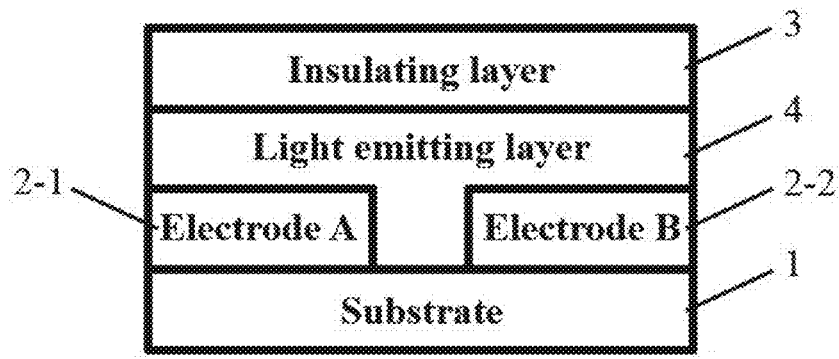
FIG. 2 shows a section view of one embodiment of the electroluminescent device.

FIG. 2 shows another embodiment of the present invention. The electrode layer is placed between the light emitting layer 4 and the substrate 1, and the insulation layer 3 is placed on the surface of the light emitting layer 4. Such planar electroluminescent devices can also be fabricated as electroluminescent writing board or lighting display devices as described above.

Figure 3:
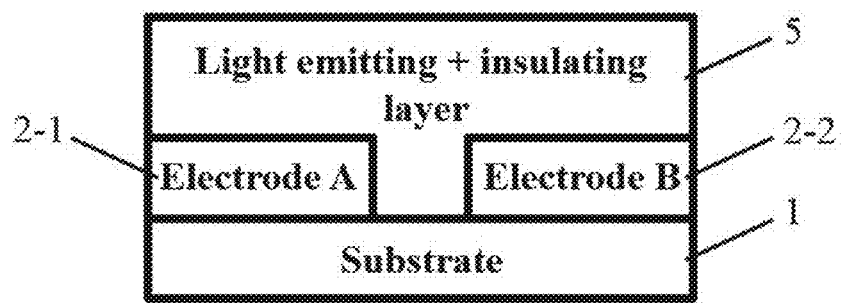
FIG. 3 shows a section view of one embodiment of the electroluminescent device.
Figure 4:
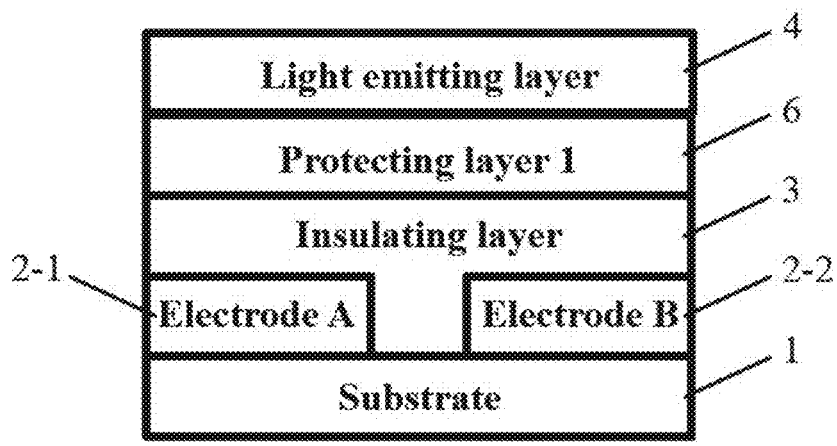
FIG. 4 shows a section view of one embodiment of the electroluminescent device as shown in FIG. 1 including protecting layer 1.
Figure 5:
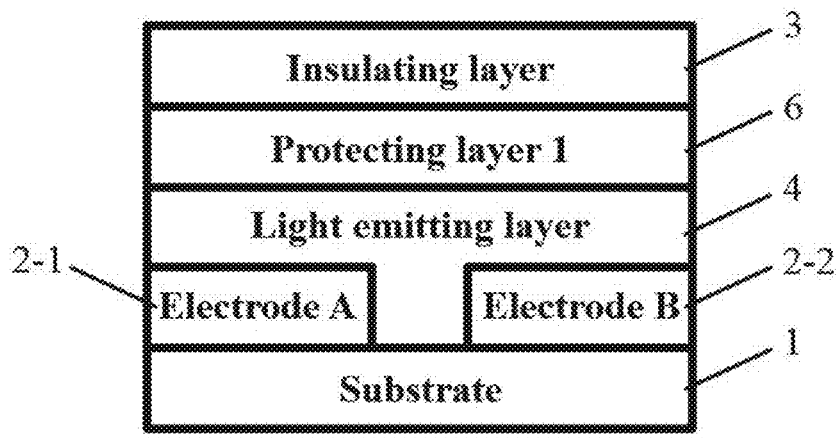
FIG. 5 shows a section view of one embodiment of the electroluminescent device as shown in FIG. 2 including protecting layer 1.
Figure 6:
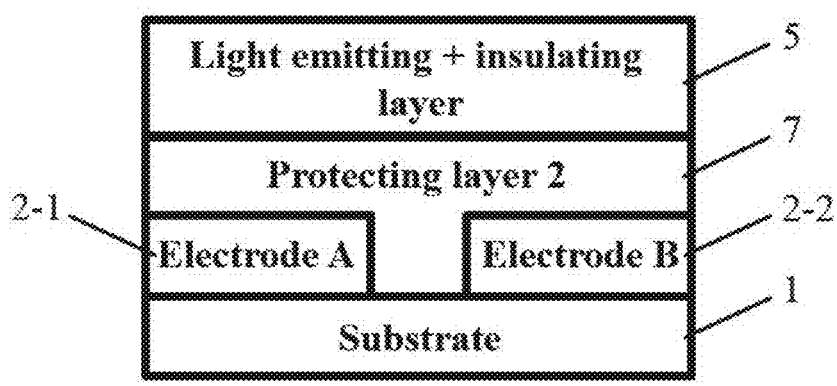
FIG. 6 shows a section view of one embodiment of the electroluminescent device as shown in FIG. 3 including protecting layer 2.
Figure 7:
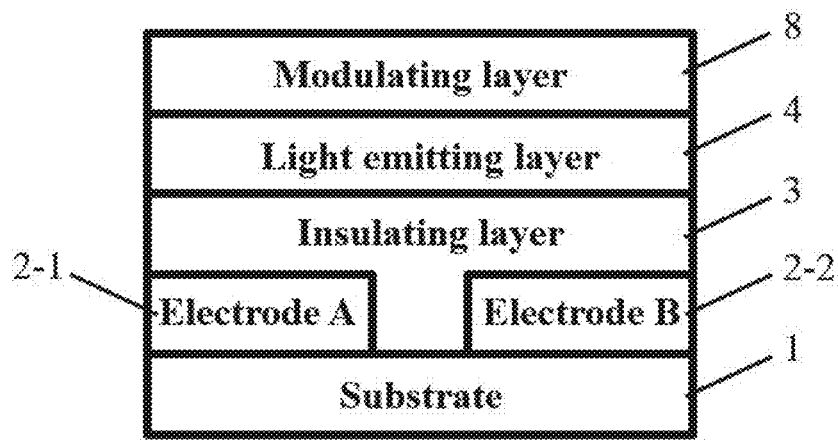
FIG. 7 shows a section view of one embodiment of the electroluminescent device as shown in FIG. 1 including a modulating layer.
Figure 8:
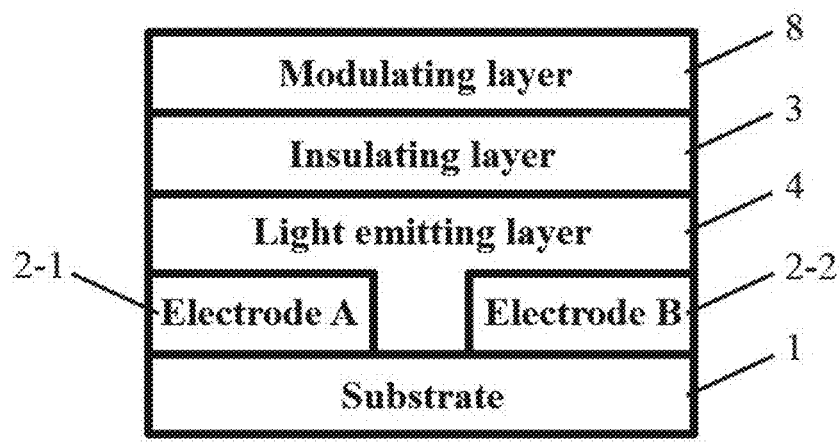
FIG. 8 shows a section view of one embodiment of the electroluminescent device as shown in FIG. 2 including a modulating layer.
Figure 9:
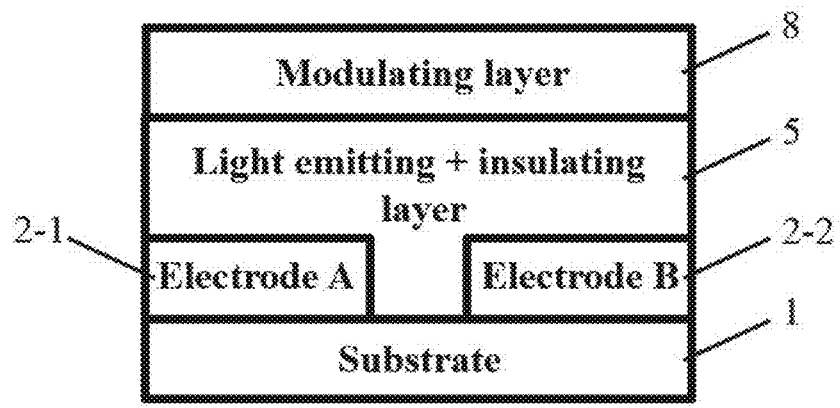
FIG. 9 shows a section view of one embodiment of the electroluminescent device as shown in FIG. 3 including a modulating layer.
Figure 10:
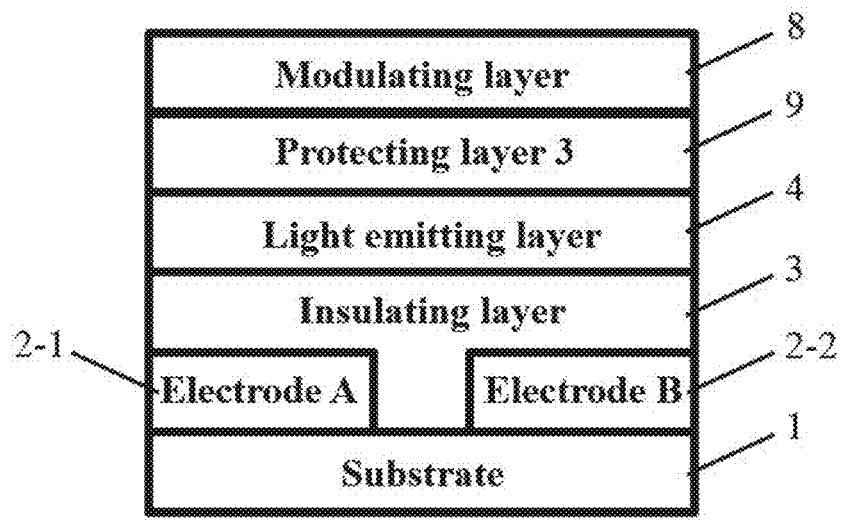
FIG. 10 shows a section view of one embodiment of the electroluminescent device as shown in FIG. 1 including a protecting layer and a modulating layer.
Figure 11:
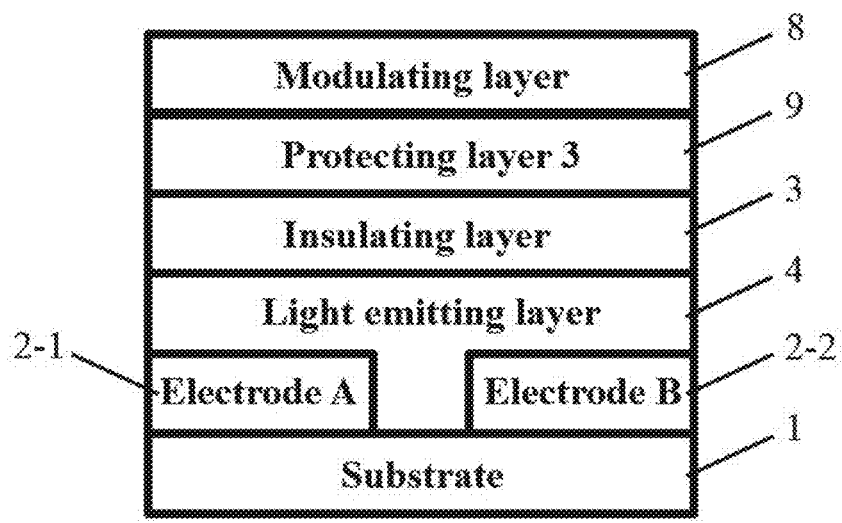
FIG. 11 shows a section view of one embodiment of the electroluminescent device as shown in FIG. 2 including a protecting layer and a modulating layer.
Figure 12:
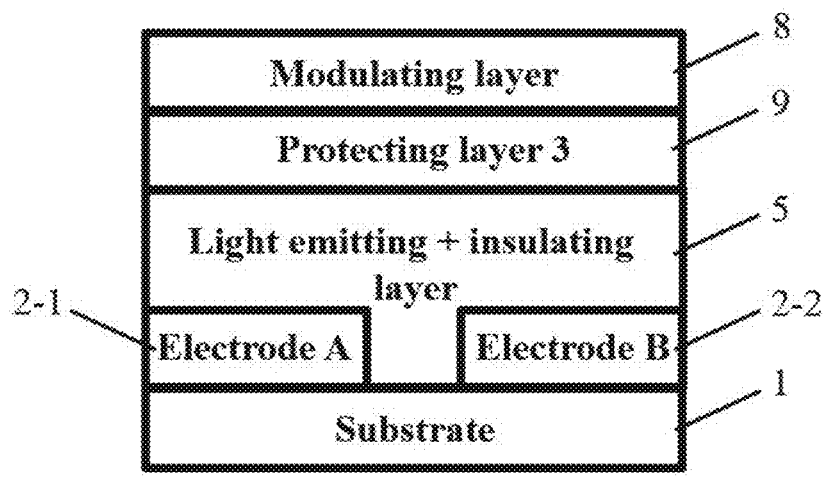
FIG. 12 shows a section view of one embodiment of the electroluminescent device as shown in FIG. 3 including a protecting layer and a modulating layer.
Figure 13:
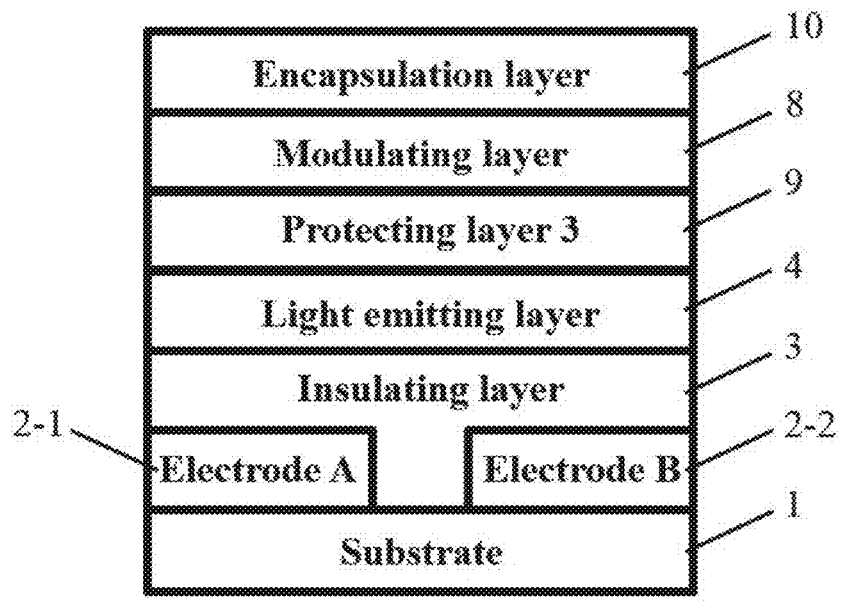
FIG. 13 shows a section view of one embodiment of the electroluminescent device as shown in FIG. 1 including a protecting layer, a modulating layer and an encapsulation layer.
Figure 14:
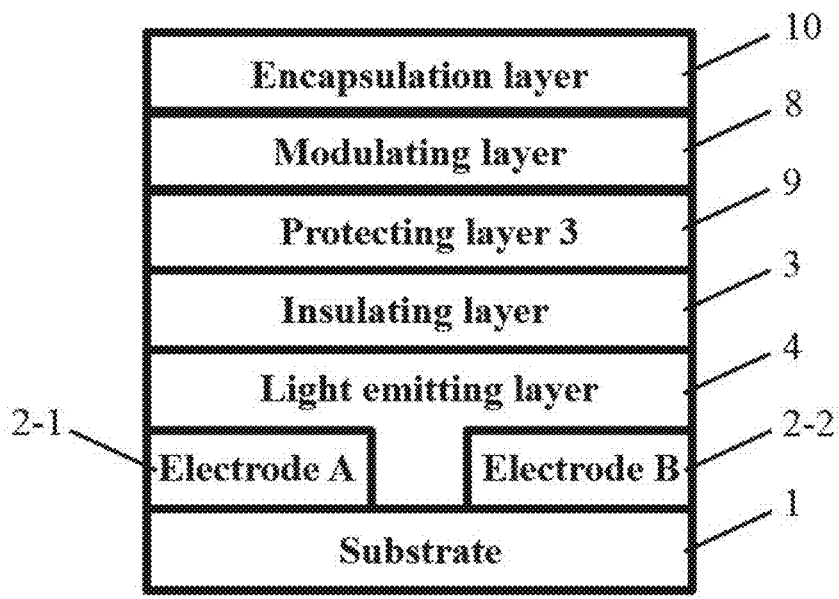
FIG. 14 shows a section view of one embodiment of the electroluminescent device as shown in FIG. 2 including a protecting layer, a modulating layer and an encapsulation layer.
Figure 15:
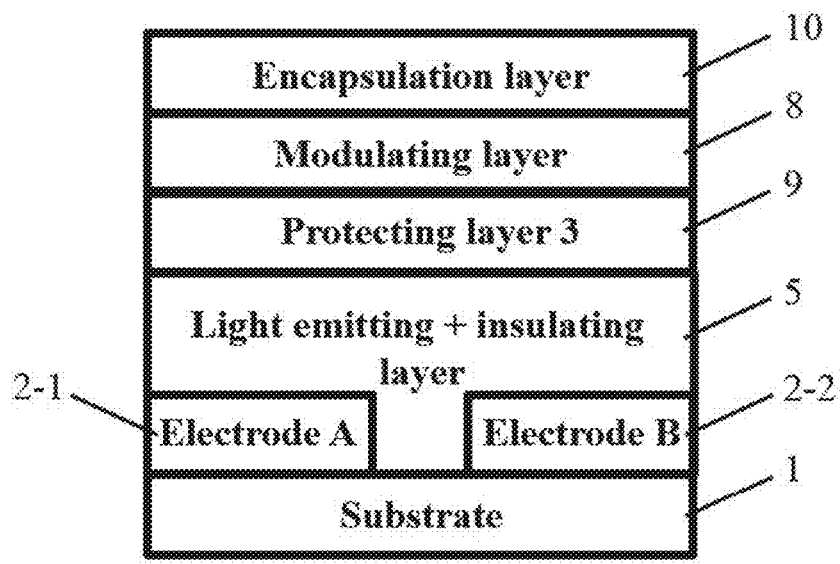
FIG. 15 shows a section view of one embodiment of the electroluminescent device as shown in FIG. 3 including a protecting layer, a modulating layer and an encapsulation layer.

FIG. 3 shows another embodiment of the present invention. The insulating layer and light emitting layer can be combined in one layer 5, and is placed above electrode layer 2-1 and 2-2.

Example 2

This example shows the relationships between different frequency, voltage and luminance when the planar electroluminescent device was configured as an electroluminescent writing board. Water is used as writing fluid.

Varying Input Voltage at Constant Frequency

Deionized water was dropped onto the planar electroluminescent device, and tested on a 3 cm×3 cm glass sheet area. EL cold light equipment was used to measure the luminance. The device was tested at constant frequency of 500 Hz, 1000 Hz, 1500 Hz, or 3000 Hz, whereas the input voltage was changed from 0 to 180 V. For example, at 500 Hz, the luminance was measured at 0-180 V; at 1000 Hz, the luminance was measured at 0-180 V; at 1500 Hz, the luminance was measured at 0-180 V; at 3000 Hz, the luminance was measured at 0-180 V.

Figure 17:
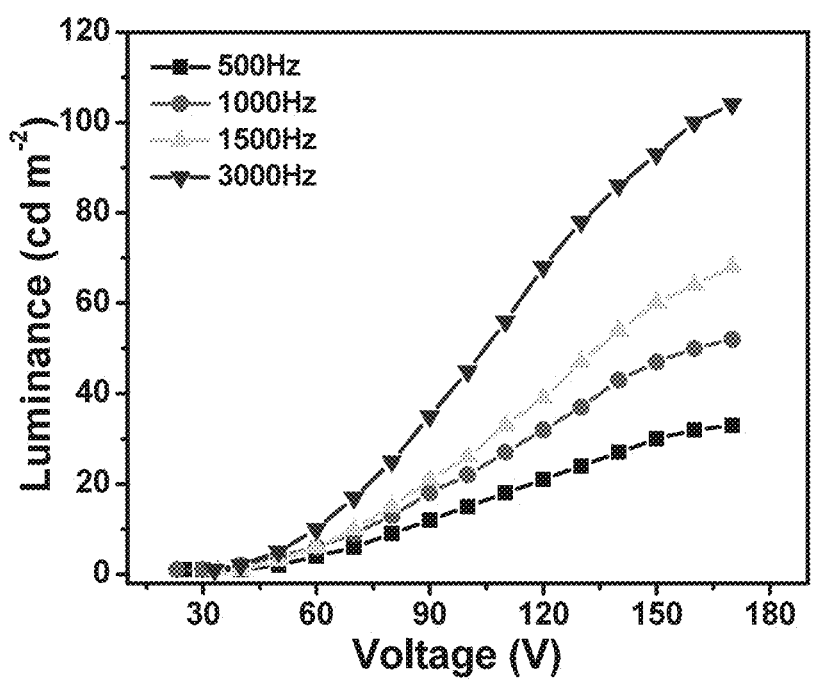
FIG. 17 shows the effects of voltage on the luminance of the electroluminescent device of the present invention.

As shown in FIG. 17, it can be seen that as the voltage is increased, the luminance is also increased. Also, as the frequency is increased, so is the luminance. And the luminance will eventually become saturated.

Varying Input Frequency at Constant Voltage

Figure 18:
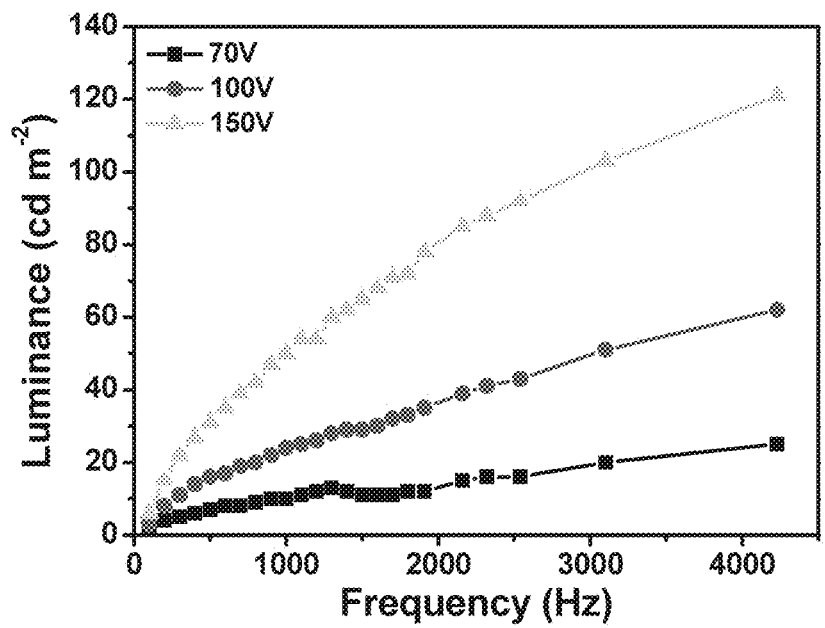
FIG. 18 shows the effects of frequency on the luminance of the electroluminescent device of the present invention.

Deionized water was dropped onto the planar electroluminescent device, and tested on a 3 cm×3 cm glass sheet area. EL cold light equipment was used to measure the luminance. The device was tested at constant voltage of 70 V, 100 V, or 150 V, whereas the input frequency changes from 0 to 4000 Hz. Results in FIG. 18 show that as the frequency is increased, the luminance is also increased. When the input voltage is increased, the luminance has a greater change in amplitude also.

In summary, at a fixed input frequency, increasing the input voltage would improve luminance. But it has a tendency toward saturation. While at a fixed input voltage, increasing the input frequency also improves luminance. The higher the voltage, the greater is the change in luminance amplitude. In addition, as the frequency is increased from low to high, the color of the planar electroluminescent device sequentially changes from green to blue, and then to purple. The device only emits light just above the electrodes, that is, the spaced region between electrode A and B does not emit light.

Example 3

This example shows the effects of the size of the gap area between adjacent electrodes on luminance. Adjacent electrodes in the EL device of example 1 have a gap area between them at 0.5 mm wide. In this example, the space between electrodes A and electrodes B is varied to 0.4 mm, 1.0 mm, 1.75 mm, or 3.2 mm. Other parts of the EL device are arranged as in those in Example 1.

Figure 19:
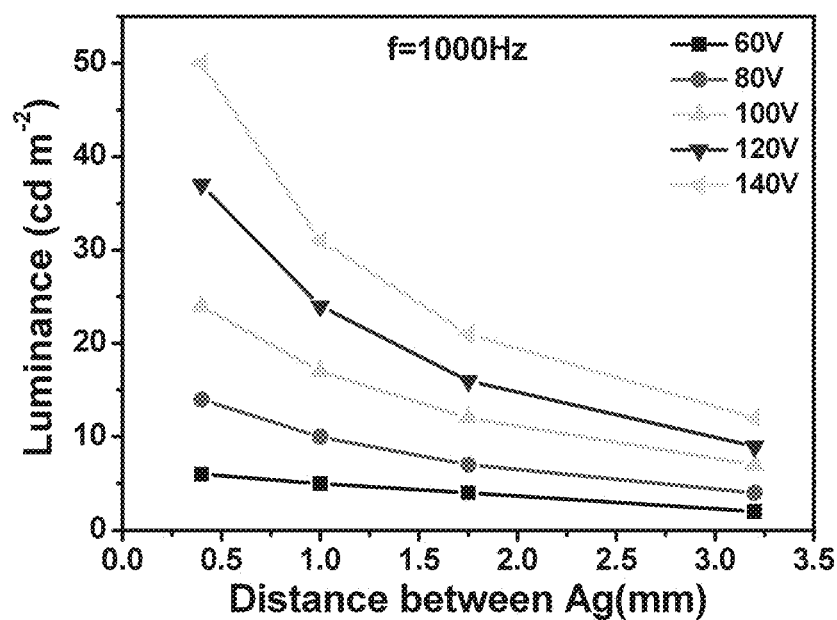
FIG. 19 shows the effects of spacing between adjacent electrodes on the luminance of the electroluminescent device of the present invention.

Deionized water was dropped onto the planar electroluminescent device, and tested on a 3 cm×3 cm glass sheet area. EL cold light equipment was used to measure the luminance. Luminance was measured at 1000 Hz at 60 V, 100 V, 120 V, or 140 V. As shown in FIG. 19, the luminance decreases when the gap width of the electrodes increases. And at higher voltage, the change in the amplitude of the luminance is also greater.

Example 4

This example examines the relationship between electrical conductivity of the writing liquid and luminance. Different concentrations of sodium chloride solutions were used a writing liquid. Luminance was measured as described above at 1000 Hz, with varying voltage of 20 V, 40 V, 60 V, 80 V, 100 V, 120 V, or 140 V. It was found that high concentrations of NaCl solution will over-heat the planar electroluminescent device when the voltage was increased. Therefore, only those concentrations of NaCl as shown in Table 1 were used.

TABLE 1

Conductivity of Different Concentrations of Sodium Chloride Aqueous Solution (25° C.)

| | Concentration of NaCl | | | |
|---|---|---|---|---|
| | 0% | 0.01% | 0.10% | 0.25% |
| Conductivity (μS/cm) | <10 | 210 | 2000 | 4750 |

Note:
The conductivity was measured at 25° C. 0% NaCl means pure water.

Figure 20:
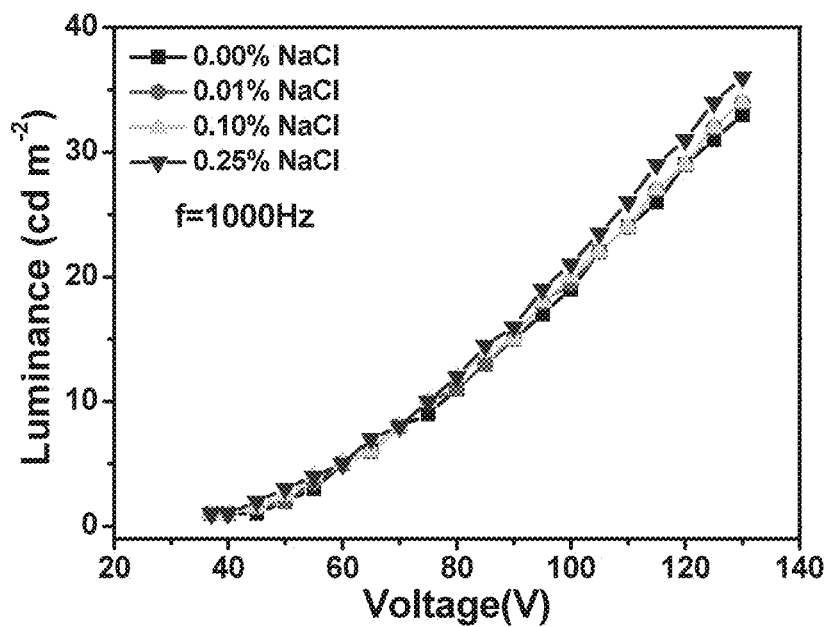
FIG. 20 shows the effects of conductivity of writing liquid on the luminance of the electroluminescent device of the present invention.

In theory it can be understood that when conductivity increases, resistance would decrease and the applied field intensity on the light emitting layer would increase, thereby increasing the luminance. However, as shown in FIG. 20, it seems the luminance does not vary much under different conductivities of the NaCl solution.

The effects of electrical conductivity on luminance were further examined using high conductivity material such as graphite powder and zinc powder. Graphite powder and metal zinc powder were sprinkled onto the surface of the EL device, and luminance was then measured. The results show that luminance was about 10 cd/m². Therefore, it seems conductivity does not have much impact on light output.

However, as shown in subsequent experiments, it was found that one reason for the apparent similar luminances under different concentrations of sodium chloride solution is that the polarity of the solution has a more significant impact on luminance. Different concentrations of sodium chloride solution have basically the same polarity, so the luminance variation is small.

Example 5

This example examines the relationship between viscosity of the writing liquid and luminance. Polyethylene glycol with different viscosity was tested. Polyethylene glycol (PEG) with different molecular weight or different degree of polymerization has different viscosity. Polyethylene glycol having molecular weight of 200 to 600 is liquid at room temperature, whereas PEG with molecular weight above 600 gradually becomes semi-solid. Thus the higher the molecular weight, the higher is the solution viscosity. In this example, PEG with molecular weight of 200, 300, or 400 was tested, i.e., PEG200, PEG300, or PEG400. The PEG was added dropwise to the surface of the planar electroluminescent device of Example 1 (3 cm×3 cm glass sheet). Luminance was measured at 1000 Hz at 20 V, 40 V, 60 V, 80 V, 100 V, 140 V, or 160 V.

Figure 21:
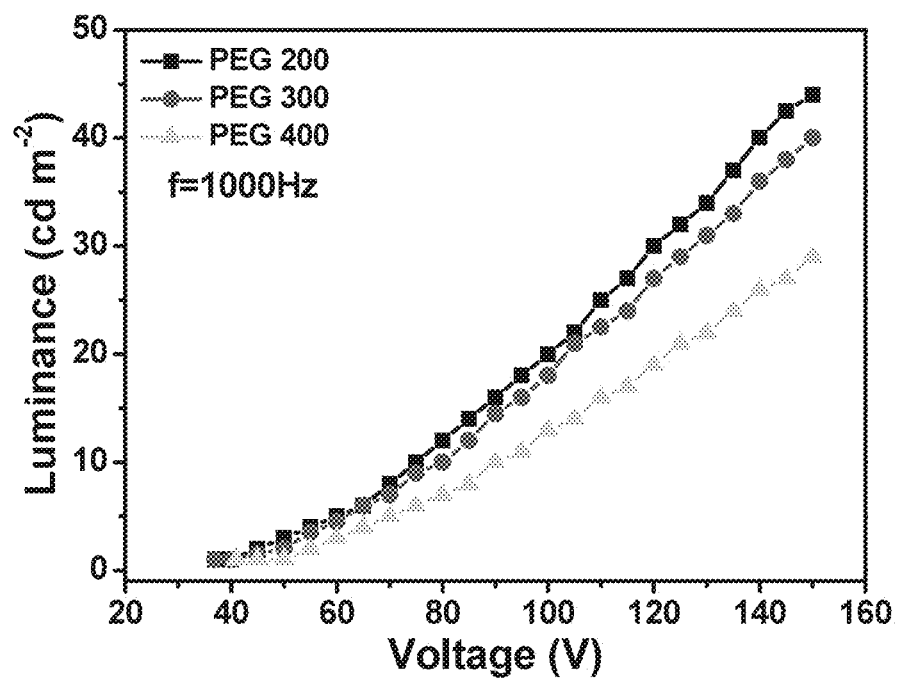
FIG. 21 shows the effects of viscosity of writing liquid on the luminance of the electroluminescent device of the present invention.

As shown in FIG. 21, the higher the viscosity, the lower is the luminance. This is because viscosity significantly impacts mobility, the higher the viscosity, the lower is the conductivity, thereby resulting in lower luminance is lower.

Example 6

This example examines the relationship between polarity of the writing liquid and luminance. Nonpolar or low-dielectric constant solvents such as toluene, petroleum ether, hexane, liquid paraffin, or dioxane were tested on the electroluminescent device of Example 1, and luminance was measured at 1000 Hz at 20 V, 40 V, 60 V, 80 V, 100 V, or 140 V. The results show that these solvents do not make the device emits light.

Figure 22:
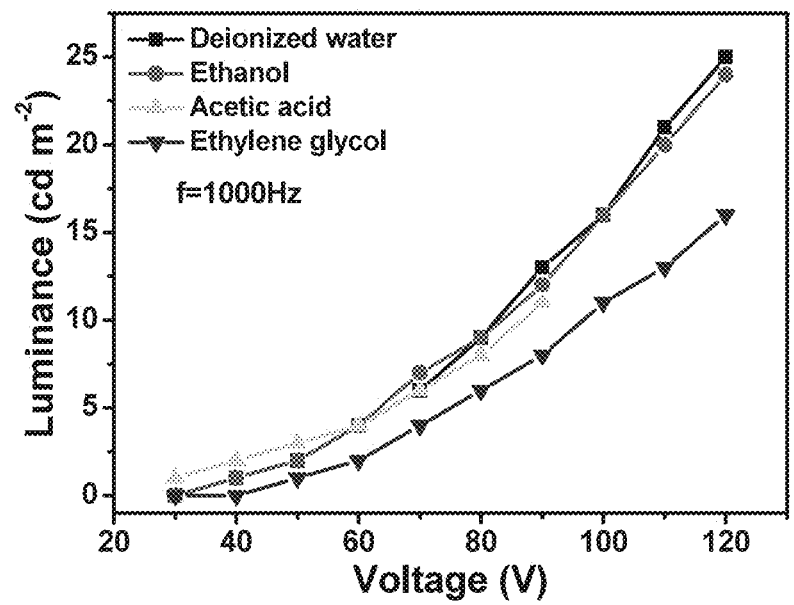
FIG. 22 shows the effects of polarity of writing liquid on the luminance of the electroluminescent device of the present invention.
Figure 23:
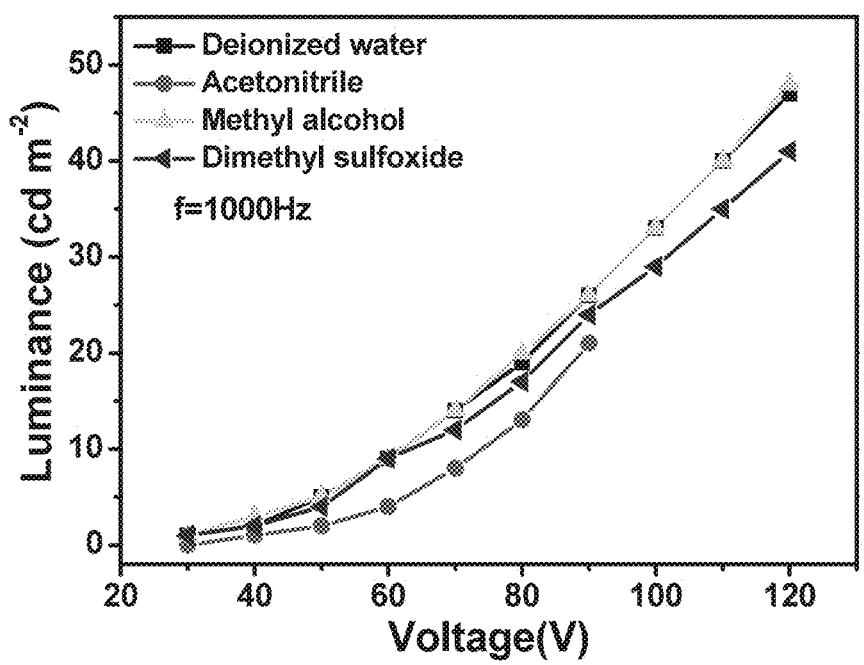
FIG. 23 shows the effects of polarity of writing liquid on the luminance of the electroluminescent device of the present invention.

Next, polar solvents were tested. The polarity, dielectric constant and viscosity of methanol, deionized water, ethanol, acetic acid, ethylene glycol, dimethyl sulfoxide and acetonitrile are shown in Table 2 and Table 3, the luminance test results are shown in FIG. 22 and FIG. 23.

TABLE 2

Luminance, Polarity And Viscosity of Different Solvents

| Luminance (from large to small) | deionized water (DI) | Ethanol (Luminance is nearly same as DI) | acetic acid | ethylene glycol |
|---|---|---|---|---|
| Polarity parameter | 10.2 | 4.3 | 6.2 | 6.9 |
| Dielectric constant (F/m) | 80.4 (20° C.) | 24.3 | 6.15 (20° C.) | 37 |
| Viscosity (cP) | 1 | 1.2 | 1.26 | 25.66 |

TABLE 3

Luminance, Polarity And Viscosity of Different Solvents

| Luminance (from large to small) | methanol | deionized water (Luminance is nearly same as methanol) | dimethyl sulfoxide | acetonitrile |
|---|---|---|---|---|
| Polarity parameter | 6.6 | 10.2 | 7.2 | 6.2 |
| Dielectric constant (F/m) | 33.7 | 80.4 (20° C.) | 48.9 (20° C.) | 37.5 (21° C.) |
| Viscosity (cP) | 0.6 | 1 | 2.24 | 0.37 |

The results show that under normal operating voltage (e.g. greater than 60 V), water and ethanol generate similar level of luminance, which is slightly brighter than that of acetic acid, which in turn generates higher luminance than ethylene glycol (see Table 2 and FIG. 22). On the other hand, the luminances of water and methanol are basically the same, which are slightly brighter than that of dimethyl sulfoxide. But dimethyl sulfoxide is brighter than acetonitrile (see Table 3 and FIG. 23).

The above results indicate that the final luminance of the planar electroluminescent device is determined by viscosity and polarity. In other words, luminance is affected by both dielectric constant and viscosity. In Table 2, water has the highest polarity and dielectric constant, lowest viscosity, and the highest luminance. The viscosity of glycol is much higher than other solvents, and it has the lowest luminance. In Table 3, the results for acetonitrile seem to be not consistent with the above conclusion. A possible reason is that the acetonitrile has dissolved the thin film of the planar electroluminescent device.

In order to determine whether the dielectric constant and polarity of the solvent solution will affect the luminance of planar electroluminescent devices, the capacitance of the EL device was measured with different solvents. The measured data include frequency f and the corresponding impedance Zim. Since the insulating layer can be considered as a capacitor, the light emitting layer can be regarded as a capacitor with a Zener diode in parallel.

Firstly, f and Zim were measured without solvent according to the formula:

$$z_{im} = \frac{1}{\omega C},$$

which leads to $\log_{10} Z_{im} = \log_{10} \omega - \log_{10} C$, wherein, ω is the angular velocity of the AC source power, $\omega = 2\pi f$ with unit in radians/sec. $\log_{10} Z_{im}$ was plotted on the vertical axis, $\log_{10} \omega$ on the abscissa, and the intersection of the x axis is $-\log_{10} C$. Hence, the total capacitance C of the device can be calculated.

The f and Zim of liquid paraffin, deionized water and methanol was measured. The results are shown in Table 4. The results show that the overall capacitance of the non-polar solvents, which does not generate light from the EL device, is very small, almost equals to the capacitance without solvent. In contrast, the overall capacitance of the solvents which make the EL device emits light is very high. This shows that polar solvents or solvents with high dielectric constant can affect luminance through the effects on the overall capacitance of the device.

TABLE 4

Total Device Capacitance

| | Solvent | | | | | |
|---|---|---|---|---|---|---|
| | no solvent | | | liquid paraffin | | |
| | Experiment number | | | | | |
| | 1 | 2 | 3 | 1 | 2 | 3 |
| Capacitance (nF) | 28.3726 | 23.0091 | 31.3979 | 22.1462 | 23.8232 | 25.6389 |
| Average capacitance (nF) | | 27.5932 | | | 23.8694 | |

| | Solvent | | | | | |
|---|---|---|---|---|---|---|
| | deionized water | | | methanol | | |
| | Experiment number | | | | | |
| | 1 | 2 | 3 | 1 | 2 | 3 |
| Capacitance (nF) | 91.9390 | 71.0886 | 71.8952 | 82.3768 | 79.2319 | 87.2770 |
| Average capacitance (nF) | | 78.3076 | | | 82.9619 | |

Example 7

This example compares EL device having the traditional vertical structure with the planar electroluminescent device of example 1.

According to a conventional fabrication method for the traditional vertical structure, the substrate is ITO plastic, which is also used as the bottom electrode. Insulating layer material is then printed on top, followed by printing the light-emitting layer, and the insulating layer again, with the last printing of Ag electrode. Since the top electrode is the opaque silver electrode, whereas the bottom electrode is the transparent ITO conductive plastic, therefore light is emitted from the bottom of the device. In contrast, solvent such as deionized water was dropped onto the surface of the planar electroluminescent device of the present invention for light emission.

Figure 24:
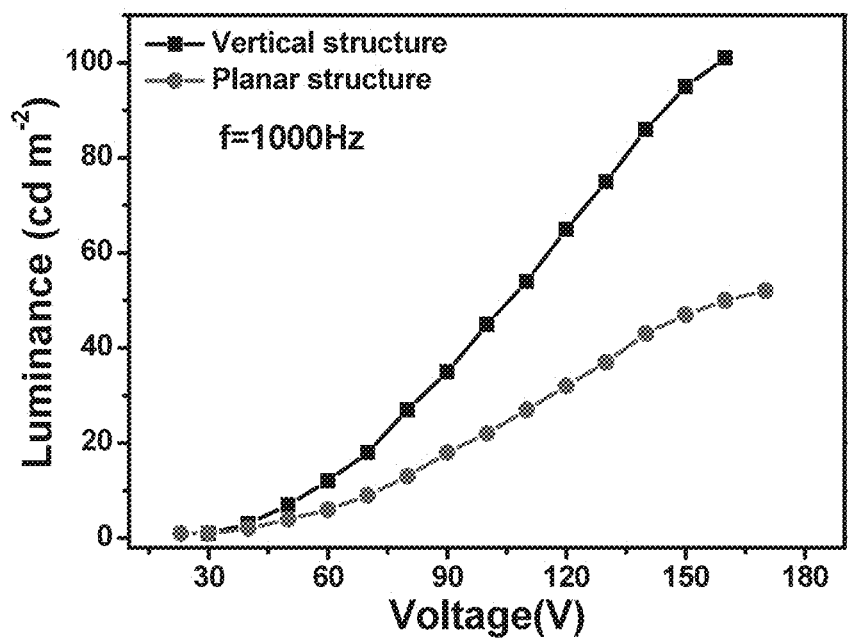
FIG. 24 shows the differences in luminance between the planar electroluminescent device of the present invention and traditional electroluminescent device with vertical structure.
Figure 25:
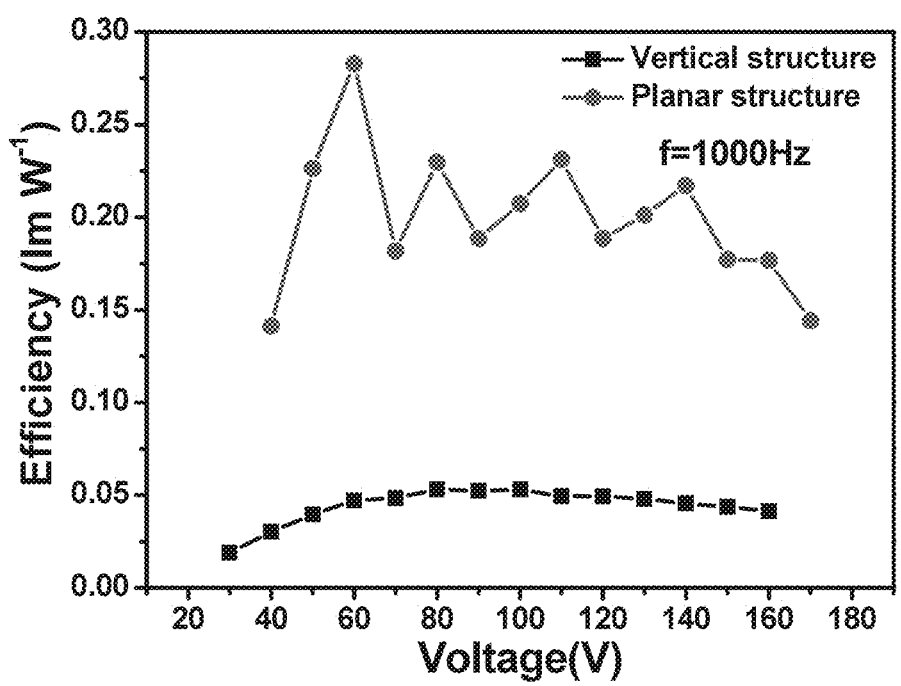
FIG. 25 shows the differences in efficiency between the planar electroluminescent device of the present invention and traditional electroluminescent device with vertical structure.

Luminance and light emission efficiency were measured at 1000 Hz under various voltages. As shown in FIG. 24, the luminance of traditional electroluminescence device is brighter than that of the planar electroluminescence device of the present invention. However, the latter has significantly better luminous efficiency as compared to the former (see FIG. 25).

Example 8

Figure 26:
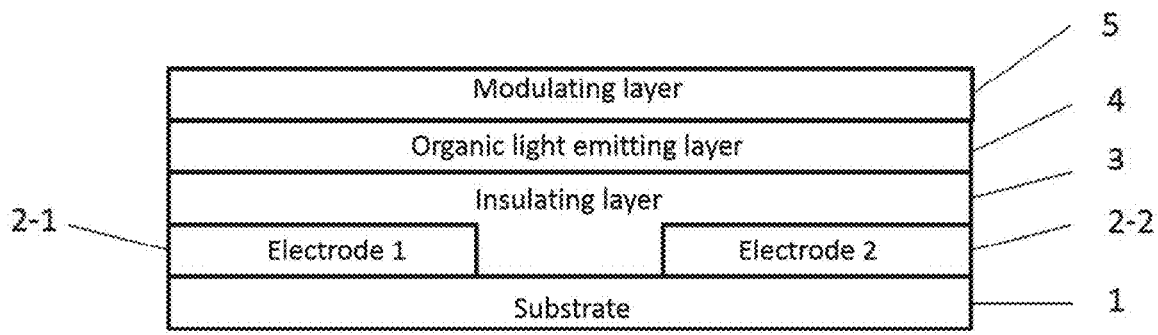
FIG. 26 shows a section view of one embodiment of a planar AC organic light emitting device.

In this example, PET plastic is used as a substrate, and the method of fabrication is vacuum evaporation. The structure of the planar AC organic light emitting device is shown in FIG. 26. Electrodes 1 and 2 are prepared on the substrate surface by shadow mask. Silver is used as electrode 1 with a thickness of 20 nm; gold is used as electrode 2 with a thickness of 50 nm. Pentoxide hafnium is deposited by ALD to work as an insulating layer with a thickness of 5 nm. Light emitting polymer-Super yellow, dissolved in chlorobenzene (10 mg/mL), is coated onto the insulating layer by spin coating; the insulating layer has a thickness of 1.2 μm. Finally, PEDOT: PSS and ionic liquid material—

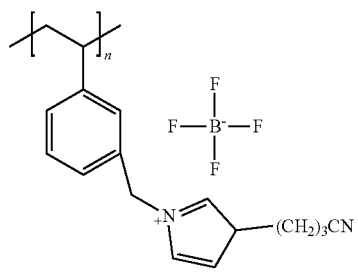

(n=10) is functions as a modulating layer (volume ratio=50:1). It was coated onto the organic light emitting layer by spin coating. The thickness of the modulating layer is 50 nm. The width of the electrodes is 1 mm; the gap between electrodes is 5 mm. Organic material is sensitive to water and oxygen. So, UV curing epoxy resin is needed to encapsulate the device. This completes the fabrication of the device. Under 100 KHz frequency, 100 V peak-peak voltage, the luminance value of the device is 325 cd/m$^2$.

Example 9

Figure 27:
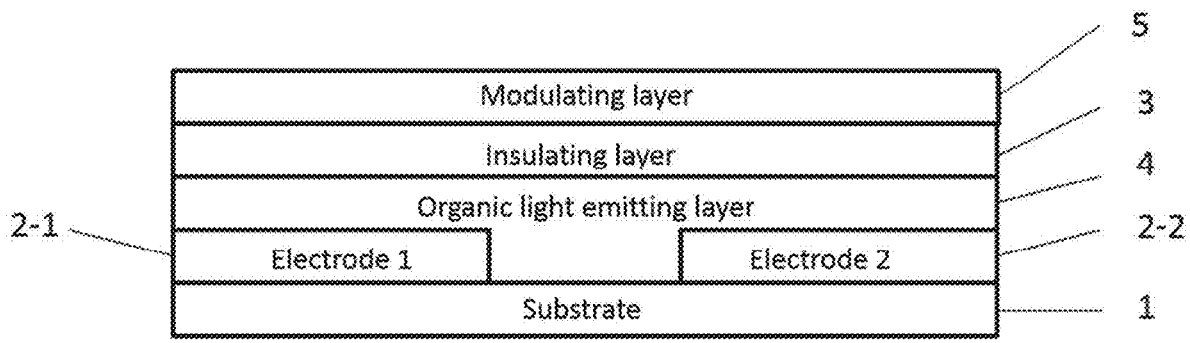
FIG. 27 shows a section view of one embodiment of a planar AC organic light emitting device.

As shown in FIG. 27, electrode 1 and electrode 2, which are not in contact with each other, are prepared on the ITO glass surface by laser etching. The thickness of the ITO is 200 nm. Then, fluorescence molecule 8-hydroxyquinoline aluminum (Alq$_3$) is deposited on the electrode surface by vacuum deposition. Pentoxide hafnium is deposited onto the organic light emitting layer by ALD with a thickness of 20 nm. Finally, copper, which is functioning as the modulating layer, is coated onto the insulating layer by vacuum evaporation. The thickness is 2 nm. The width of the electrodes is 5 mm; the gap between electrodes is 10 mm. Organic material is sensitive to water and oxygen. So, UV curing epoxy resin is needed to encapsulate the device. This completes the fabrication of the device. Under 100 KHz frequency, 100 V peak-peak voltage, the luminance value of the device is 578 cd/m$^2$.

Example 10

Figure 28:
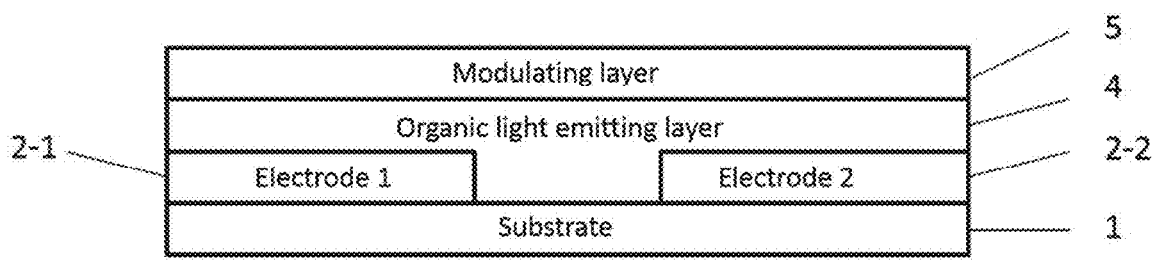
FIG. 28 shows a section view of one embodiment of a planar AC organic light emitting device.

As shown in FIG. 28, electrode 1 and electrode 2, which are not in contact with each other, are prepared on the ITO glass surface by laser etching. The thickness of the ITO is 200 nm. Then, HTL material-NPB, fluorescence molecule-Alq$_3$, ETL material-Bphen are deposited in turn by vacuum deposition. The thicknesses are 30 nm, 50 nm, 10 nm, respectively. Pentoxide hafnium is deposited onto the organic light emitting layer by ALD with a thickness of 20 nm. Finally, copper, which is function as the modulating layer, is coated on the insulating layer by vacuum evaporation. The thickness is 2 nm. The width of the electrodes is 1 mm; the gap between electrodes is 1 mm. Organic material is sensitive to water and oxygen. So, UV curing epoxy resin is needed to encapsulate the device. This completes the fabrication of the device. Under 100 KHz frequency, 100 V peak-peak voltage, the luminance value of the device is 2366 cd/m$^2$.

Example 11

Following the structure shown in FIG. 28, electrode 1 and electrode 2, which are not in contact with each other, are prepared on the glass surface by shadow mask. Silver is used as electrode 1 with a thickness of 20 nm; gold is used as electrode 2 with a thickness of 50 nm. Then, light emitting polymer F8BT and core-shell structure of CdTe @ ZnS quantum dots are mixed with a weight ratio of 10:1, and dissolved in methylbenzene. The mixture is coated onto the electrode surface by 3D printing. The thickness is 300 nm. Finally, gold, which is functioning as the modulating layer, is coated onto the organic light emitting layer by vacuum evaporation. The width of the electrodes is 3 mm; the gap between electrodes is 1 cm. Organic material is sensitive to water and oxygen. So, UV curing epoxy resin is needed to encapsulate the device. This completes the fabrication of the device. Under 100 KHz frequency, 100 V peak-peak voltage, the luminance value of the device is 8600 cd/m$^2$.

Example 12

Figure 29:
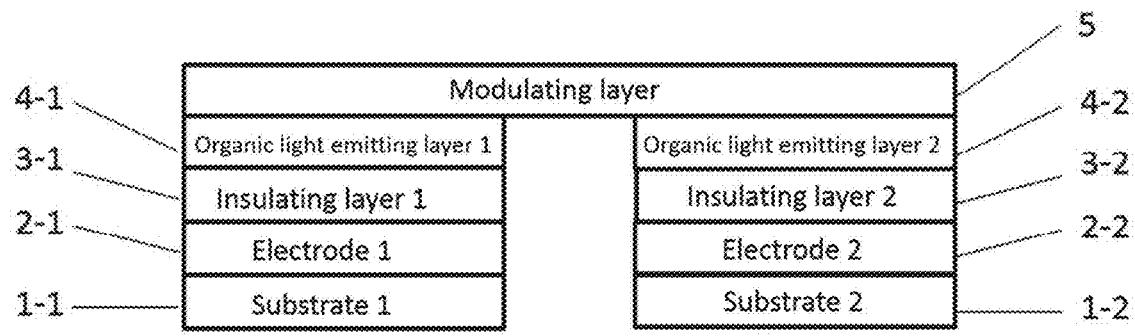
FIG. 29 shows a section view of one embodiment of a planar AC organic light emitting device.

PET and PEN are used as substrate 1 and substrate 2, respectively. As shown in FIG. 29, electrode 1 and electrode 2 are prepared on substrate 1 and substrate 2 by vacuum evaporation through shadow mask. Electrode 1 is a gold electrode, with a thickness of 50 nm. Electrode 2 is an Al—Cu alloy electrode, with a thickness of 40 nm. Then, SiO$_2$, which is functioning as insulating layer 1, is deposited on electrode 1 by chemical vapor deposition (CVD) method. Then, barium titanate (BaTiO$_3$), which is functioning as insulating layer 2, is deposited on electrode 2 by spin coating. Organic light emitting layer 1 is coated onto insulating layer 1 by spin coating. Host material-PVK and dopant material-Ir(ppy)$_3$ are mixed with a weight ratio of 10:1. A little bit of MWCNT (0.05 wt %) is added to improve the ability of charge transfer. They are dissolved in chlorobenzene (20 mg/ml). The thickness of the light emitting layer is 50 nm. Organic light emitting layer 2-Cs$_2$CO$_3$ (1 nm)\TPBi (10 nm)\Ir(piq)$_2$(acac) (0.1 nm)\TCTA (20 nm)\Flrpic(0.1 nm)\TPBi (10 nm)\ Cs$_2$CO$_3$ (1 nm) is coated onto insulating layer 2 by vacuum evaporation. Finally, Al, which is functioning as the modulating layer, is coated on organic light emitting layer 1 and 2 by vacuum evaporation. The width of the electrodes is 2 mm; the gap between electrodes is 1 cm. Organic material is sensitive to water and oxygen. So, UV curing epoxy resin is needed to encapsulate the device. This completes the fabrication of the device. Under 30 KHz frequency, 50 V peak-peak voltage, the luminance value of the devices are 1200 cd/m$^2$ and 785 cd/m$^2$, respectively.

Example 13

Figure 30:
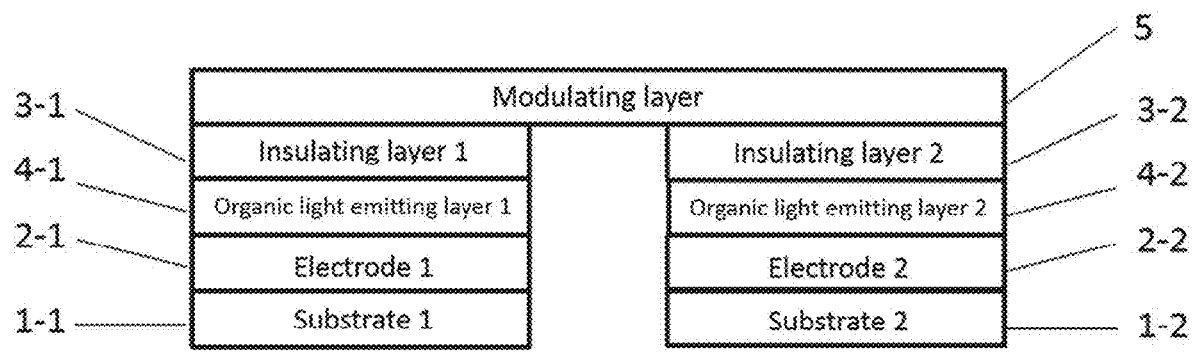
FIG. 30 shows a section view of one embodiment of a planar AC organic light emitting device.

Firstly, choosing glass as substrate 1 and substrate 2. As shown in FIG. 30, etched ITO is used as electrode 1, with a thickness of 100 nm. For electrode 2, carbon nanotube is printed on substrate 2 by 3D printing. The thickness of electrode 2 is 2 μm. 2D organic inorganic hybrid perovskite materials-(NMA)$_2$PbI$_4$ is fabricated on electrode 1 as organic light emitting layer 1. Specifically, 1-naphthylmethylamine iodide (NMAI), ForMaMidiniuM Iodide (FAI) and PbI$_2$ are dissolved in DMF with an atomic ratio of 2:1:2. The precursor is spun onto the electrode layer. Then, 2D organic inorganic hybrid perovskite materials-(NMA)$_2$PbI$_4$ is added with a thickness of 3 nm. Light emitting polymer-MEH-PPV and quantum dots nanowire CdS is mixed with a weight ratio of 20:1 as organic light emitting layer 2. A little bit of SWCNT (0.01 wt %) is added to improve the ability of charge transfer. They are dissolved in chlorobenzene (5 mg/ml) and spun onto the electrode surface. The thickness is 10 nm. P(VDF-TrFE) dissolved in chlorobenzene (20 mg/ml) is used as insulating layer 1 material. It's spun onto the organic light emitting layer 1. The thickness is 50 nm. For insulating layer 2, polymethyl methacrylate (PMMA) and polystyrene is mixed with a weight ratio of 1:1. They are dissolved in DMF (5 mg/ml) and spun onto organic light emitting layer 2. The thickness is 300 nm. Finally, copper which is functioning as the modulating layer is coated onto insulating layer 1 and 2 by vacuum evaporation. The width of electrode 1 and 2 are 2 mm and 1 mm, respectively. The gap between electrodes is 1 cm. Organic material is sensitive to water and oxygen. So, UV curing epoxy resin is needed to encapsulate the device. This completes the fabrication of the device. Under 60 KHz frequency, 100 V peak-peak voltage, the luminance value of the devices are 5200 cd/m² and 350 cd/m², respectively.

Example 14

Figure 31:
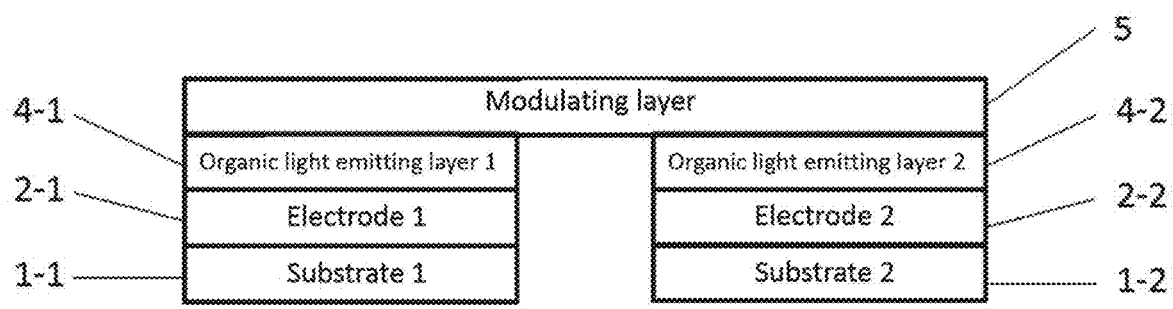
FIG. 31 shows a section view of one embodiment of a planar AC organic light emitting device.
Figure 32:
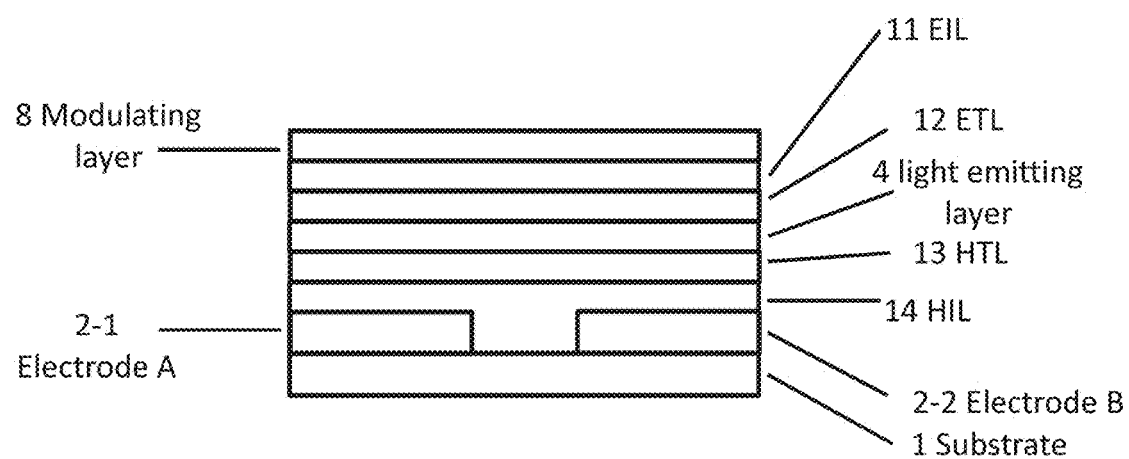
FIGS. 32-35 shows section view of different embodiments of a planar AC organic light emitting device.
Figure 33:
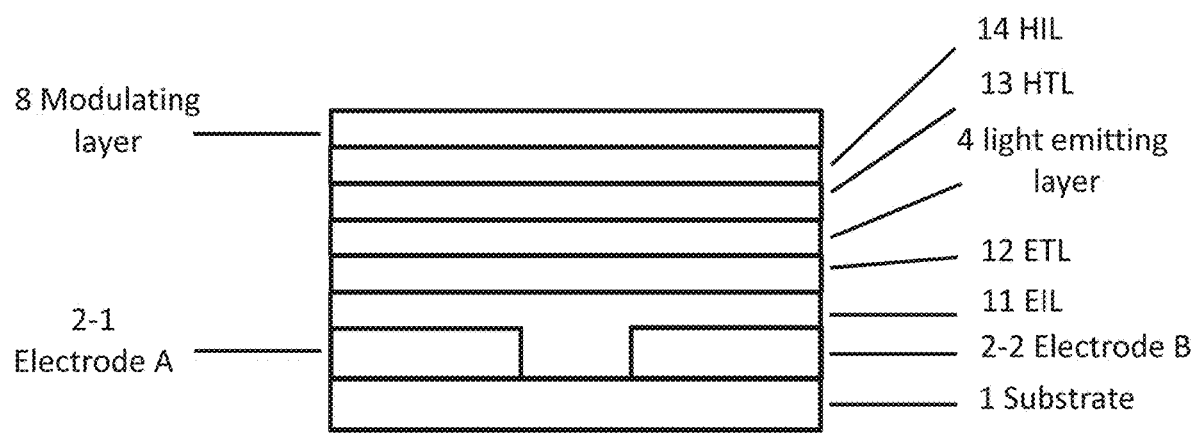
Figure 34:
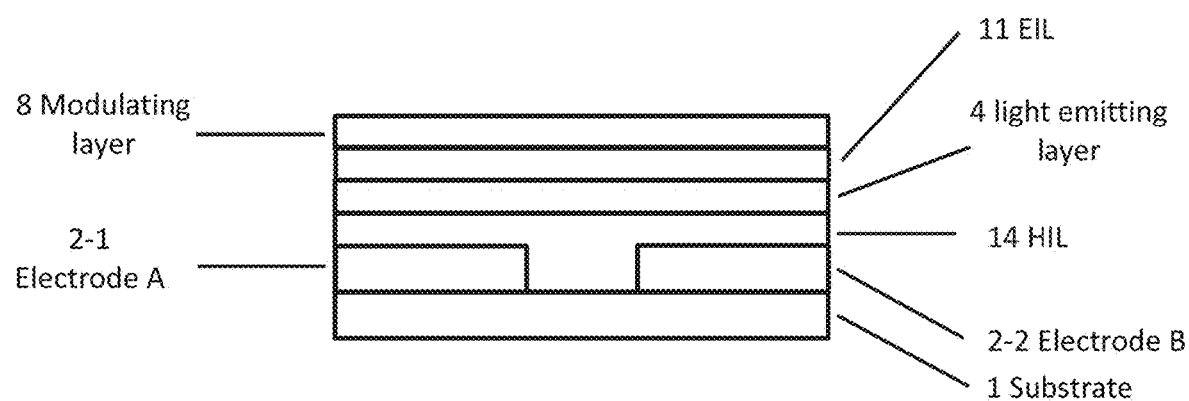
Figure 35:
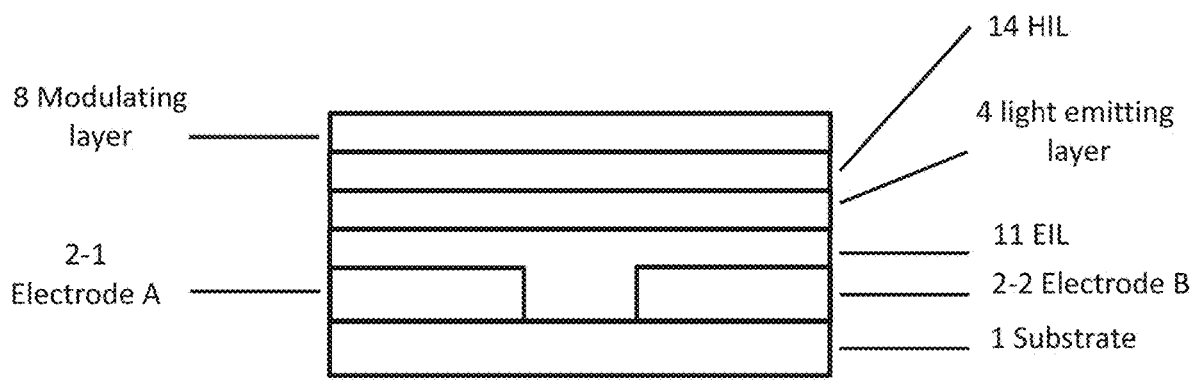

Glass is used as substrate 1 and substrate 2. As shown in FIG. 31, etched ITO is used as electrode 1, with a thickness of 100 nm. For electrode 2, carbon nanotube is printed on substrate 2 by 3D printing. The thickness of electrode 2 is 2 μm. 2D organic inorganic hybrid perovskite materials-$(NMA)_2PbI_4$ is fabricated on electrode 1 as organic light emitting layer 1. Specifically, 1-naphthylmethylamine iodide (NMAI), ForMaMidiniuM Iodide (FAI) and $PbI_2$ are dissolved in DMF with an atomic ratio of 2:1:2. The precursor is spun onto the electrode layer. Then, 2D organic inorganic hybrid perovskite materials-$(NMA)_2PbI_4$ is added with a thickness of 3 nm. Light emitting polymer-MEH-PPV and quantum dots nanowire CdS is mixed with a weight ratio of 20:1 as organic light emitting layer 2. A little bit of SWCNT (0.01 wt %) is added to improve the ability of charge transfer. They are dissolved in chlorobenzene (5 mg/ml) and spun onto the electrode surface. The thickness is 10 nm. Finally, copper which is functioning as the modulating layer is coated onto organic light emitting layer 1 and 2 by vacuum evaporation. The width of electrode 1 and 2 are 2 mm and 1 mm, respectively. The gap between electrodes is 1 cm. Organic material is sensitive to water and oxygen. So, UV curing epoxy resin is needed to encapsulate the device. This completes the fabrication of the device. Under 60 KHz frequency, 100 V peak-peak voltage, the luminance value of the devices are 7800 cd/m² and 600 cd/m², respectively.

What is claimed is:

1. A planar electroluminescent device comprising a substrate layer, an electrode layer, a light emitting layer, and a modulating layer, wherein the electrode layer comprises a plurality of electrodes that are arranged on a same level over the substrate layer, there is no contact between adjacent electrodes, and the adjacent electrodes are made from same or different materials, wherein the modulating layer comprises cations of one of the following ionic conductive material:

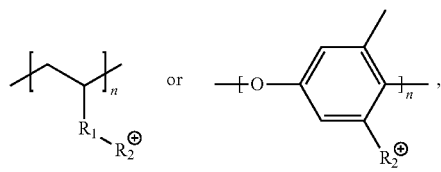

where,

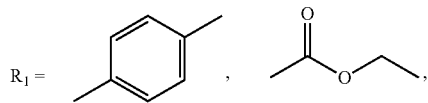

methyl, ethyl, propyl (n-, iso-), or butyl (n-, iso-, tert-);

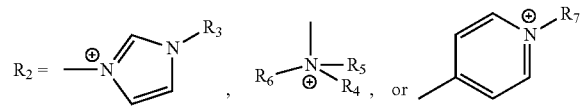

wherein $R_3$-$R_7$ is methyl, ethyl, propyl (n-, iso-), hydroxy, carboxyl, butyl (n-, iso-, tert-), or $(CH_2)_2CN$, n=3 or 5.

2. The device of claim 1, further comprising one or more of hole injection layer (HIL), hole transport layer(HTL), electron injection layer (EIL) and electrode transport layer (ETL).

3. The device of claim 1, wherein the substrate material is made from glass, plastic, ceramic, cloth, wood, metal, or combinations thereof.

4. The device of claim 1, further comprises an insulating layer which is sandwiched (i) between said electrode layer and said light emitting layer, or (ii) between said light emitting layer and said modulating layer.

5. The device of claim 4, wherein the insulating layer is made from doped or undoped organic or inorgainc high dielectric constant materials with a conductivity in the range of 1E-9 S/cm to 1E-3 S/cm.

6. The device of claim 2, wherein the hole injection layer (HIL), hole transport layer(HTL), electron injection layer (EIL) and electrode transport layer (ETL) are made from doped or undoped materials with a conductivity in the range of 1E-9 S/cm to 1E-3 S/cm.

7. The device of claim 2, wherein the hole injection layer (HIL) comprises one or more of copper phthalocryanine (CuPc), acid-doped PEDOT(poly-3,4-ethylenedioxythiophene), polyaniline (PANi), or polypyrrole (Ppy), 4,4'-bis[(p-trichlorosolylpropyl-pjenyl)phenyla-mino]biphenyl ($TPD-Si_2Cl$), 4,4'-bis[p-methyloxylsilylpropylphenyl]phenyamino]-biphenyl ($TPD-SI_2Ome$), $SiO_2$, $SiO_xN_y$ and $TiO_2$ or combinations thereof.

8. The device of claim 2, wherein the hole transport layer (HTL) comprises one or more of N,N'-(3-methylphenyl)-1,1'-biphenyl-4,4'-diamine (TPD), 4,4'-bis[N-(1-naphthyl-1)-N-phenyl-amino]-biphenyl (α-NPD), 1,3,4,5,6,7-hexaphenyl-2-{3'-(9-ethylcarbazolyl)}-isoindole (HPCzI) and 4,4',4"-tri(N-dibenzo[a,g]carbazoyl)triphenylamine (TDCTA) or combinations thereof.

9. The device of claim 2, wherein the electron injection layer (EIL) comprises one or more of $Li_2O$, $Cs_2CO_3$, LiF, CsF, Liq, LiMeq, Naq, Liacac, LiBPP or combinations thereof.

10. The device of claim 2, wherein the electron injection layer (ETL) comprises one or more of $Alq_3$, bis(2-(2-hydroxphenyl)benzothiazolate)zinc(II) ($Zn(BTZ)_2$), 1,3,5-tris(N-phenylbenzimidizol-2-yl)benzene (TPBI), Beryllium chelates bis(2-(2-hydroxyphenyl)-pyridine)beryllium ($Beq_2$),bis(10-hydro-xybenzo-quinolinato)beryllium ($BeBq_2$) and 5(4-biphenyl)-2-(4-tert-buty-phenyl)-1,3,4-oxadiazole (PBD) or combinations thereof.

11. The device of claim 1, wherein the light emitting layer has a thickness of about 0.01 nm-500 μm.

12. The device of claim 1, wherein the light emitting layer comprises one or more materials selected from the group consisting of organic light emitting polymers, organic light emitting molecules, thermally activated delayed fluorescence (TADF) material, inorganic or organic-inorganic hybrid perovskite materials, and quantum dots materials.

13. The device of claim 1, wherein the modulating layer has a thickness of 0.01 nm-10 cm.

14. The device of claim 1, wherein the modulating layer further comprises one or more of electronic conductive material, ionic conductive material, polar material, ionic liquid, water gel, gel electrolyte, or solid electrolyte.

15. The device of claim 1, wherein the modulating layer further comprises fluorescence or phosphorescence materials.

16. The device of claim 1, wherein the modulating layer further comprises anions of one of the following ionic conductive material:

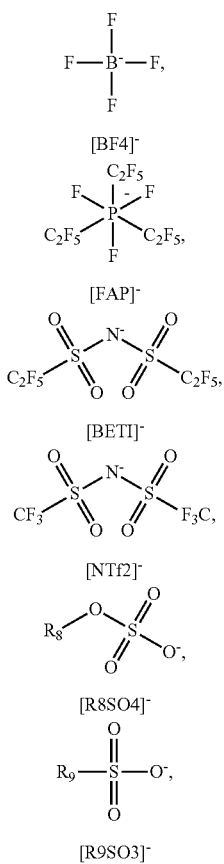

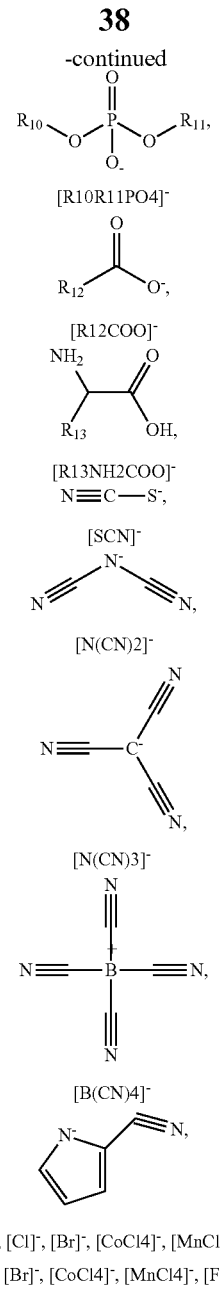

[2-CNpyr]$^-$, [Cl]$^-$, [Br]$^-$, [CoCl4]$^-$, [MnCl4]$^-$, [FeCl4]$^-$.

[Cl]$^-$, [Br]$^-$, [CoCl4]$^-$, [MnCl4]$^-$, [FeCl4]$^-$.

Where, $R_3$~$R_{13}$ is methyl, ethyl, propyl (n-, iso-), hydroxy, carboxyl, butyl (n-, iso-, tert-), $(CH_2)_2CN$ (n=3, 5).

* * * * *